United States Patent [19]
Cantone et al.

[11] Patent Number: 5,594,657
[45] Date of Patent: Jan. 14, 1997

[54] SYSTEM FOR SYNTHESIZING FIELD PROGRAMMABLE GATE ARRAY IMPLEMENTATIONS FROM HIGH LEVEL CIRCUIT DESCRIPTIONS

[75] Inventors: Michael R. Cantone, Westfield; Nam-Sung Woo, New Providence, both of N.J.

[73] Assignee: Lucent Technologies Inc., Murray Hill, N.J.

[21] Appl. No.: 473,620

[22] Filed: Jun. 7, 1995

Related U.S. Application Data

[62] Division of Ser. No. 127,564, Sep. 27, 1993, abandoned.

[51] Int. Cl.$^6$ ....................................... G06F 17/50
[52] U.S. Cl. .................. 364/490; 364/488; 364/489; 364/491
[58] Field of Search .................... 364/488–491, 364/578

[56] References Cited

U.S. PATENT DOCUMENTS

| | | | |
|---|---|---|---|
| 4,656,603 | 4/1987 | Dunn | 364/900 |
| 4,813,013 | 3/1989 | Dunn | 364/900 |
| 4,922,432 | 5/1990 | Kobayashi et al. | 364/490 |
| 4,964,056 | 10/1990 | Bekki et al. | 364/488 |
| 4,965,741 | 10/1990 | Winchell et al. | 364/513 |
| 5,019,961 | 5/1991 | Addesso et al. | 364/192 |
| 5,050,091 | 9/1991 | Rubin | 364/488 |
| 5,111,413 | 5/1992 | Lazansky et al. | 364/578 |

(List continued on next page.)

OTHER PUBLICATIONS

Sangiovanni–Vincentelli et al., "Synthesis Methods for Field Programmable Gate Arrays," Proc. of the IEEE, vol. 81, No. 7, Jul. 1993 pp. 1057–1083.

Kelem et al., "Shortening the Design Cycle for Programmable Logic Devices," IEEE Design & Test of Computers, Dec. 1992, pp. 40–50.

Knapp, "Optimizing Programmable Gate Array Designs," 1988 Electro Conference Record May 10–12, Los Angeles, CA, pp. 1–7.

"The Evolution of PLD, CPLD and FPGA design tools," Electronic Engineering, Oct. 1993, pp. 541–548. (No Author).

(List continued on next page.)

*Primary Examiner*—Kevin J. Teska
*Assistant Examiner*—Leigh Marie Garbowski

[57] ABSTRACT

A system is disclosed for synthesizing field programmable gate array (FPGA) implementations from high level circuit descriptions. A designer may describe circuits using a textual language or a graphics tool. The system will compile such circuit descriptions into technology mapped descriptions for use with FPGA's.

The system will support both random logic circuits and data path circuits. The system uses advanced optimization techniques to produce efficient FPGA implementations. Thus, the system produces high quality results while providing users with a high level of abstraction in design, and thus frees the user from architectural details of the target FPGA.

29 Claims, 25 Drawing Sheets

5,594,657
Page 2

U.S. PATENT DOCUMENTS

| | | | |
|---|---|---|---|
| 5,128,871 | 7/1992 | Schmitz | 364/490 |
| 5,140,526 | 8/1992 | McDermith et al. | 364/488 |
| 5,187,788 | 2/1993 | Marmelstein | 395/700 |
| 5,197,016 | 3/1993 | Sugimoto et al. | 364/490 |
| 5,220,512 | 6/1993 | Watkins et al. | 364/489 |
| 5,222,030 | 6/1993 | Dangelo et al. | 364/489 |
| 5,224,056 | 6/1993 | Chene et al. | 364/490 |
| 5,301,336 | 4/1994 | Kodosky et al. | 395/800 |
| 5,309,045 | 5/1994 | Saeki et al. | 307/465 |
| 5,337,255 | 8/1994 | Seidel et al. | 364/489 |
| 5,367,468 | 11/1994 | Fukusawa et al. | 364/490 |
| 5,377,318 | 12/1994 | Wolber | 395/159 |
| 5,448,493 | 9/1995 | Topolewski et al. | 364/489 |

OTHER PUBLICATIONS

XILINX, Inc., "X–BLOX™ Design Tool User Guide", Jan. 1992, pp. 1–100.

Hebert, "An Integrated Design and Characterization Environment for the Development of a Standard Cell Library," 1991 IEEE Custom IC Conference, pp. 25.6.1–25.6.5.

May et al., "Placement and Routing for Logic Schematics," *Computer–Aided Design,* vol. 15, No. 3, May 1983, pp. 115–122.

"LPM–Library of Parameterized Modules," Proposed Standard 2.0, Jul. 31 '92. (No Author).

Sakowski, "Elements of a Design Framework for Module Generators Design and Usage," 1991 CSI/IEEE Int'l Symposium on VLSI Design, pp. 88–93.

Kelem et al., "Context–Based ASIC Synthesis,"EURO ASIC '92, pp. 226–231.

Lacroix et al., "An Interactive Graphical Approach to Module Generator Development," IEEE 1990 Custom IC Conference, pp. 30.1.1–30.1.5.

Li et al., "AISCE: A Layout Synthesis System for ASIC Design," 1991 China Int'l Conference on Circuits and Systems, pp. 419–422.

SYSTEM FOR SYNTHESIZING FIELD PROGRAMMABLE GATE ARRAY IMPLEMENTATIONS FROM HIGH LEVEL CIRCUIT DESCRIPTIONS

This is a division of application Ser. No. 08/127,564 filed Sep. 27, 1993, now abandoned.

FIELD OF THE INVENTION

This invention relates generally to computer aided design (CAD) of electronic circuits. More particularly, the present invention relates to a synthesis system for developing field programmable gate array (FPGA) implementations from high level descriptions of electronic circuits. The system produces high quality results while providing users with a high level of abstraction in design, and thus frees users from the architectural details of the FPGA.

BACKGROUND OF THE INVENTION

A field programmable gate array (FPGA) consists of a matrix of programmable logic cells and programmable routing between the programmable logic cells. Each logic cell typically contains various electronic components such as static RAM cells, multiplexers and flip-flops. The functionality of each logic cell may be programmed by writing to the static ram cells and changing the internal configuration of the logic cell.

Similarly, the logic cells within the FPGA are also connected to each other by programmable connection points (e.g. static RAM cells or antifuse points) to allow programmable routing. By writing to these static ram cells, the routing between logic cells may be programmed, and the configuration of the FPGA determined.

Initially, first generation FPGA's were well-suited to implement random logic circuits. A random logic circuit is a collection of electronic components, such as logic gates, to implement control functions. The then existing CAD design tools were suitable for these first generation FPGA's.

Next generation FPGA's were subsequently developed which supported data path circuits. Data path circuits are circuits which manipulate data in groups. For example, some of the basic elements of data path circuits are accumulators, registers, memory, etc. For example, the Optimized Reconfigurable Cell Array (ORCA) FPGA, developed by AT&T, supports data path circuits in many ways. Each logic cell, called a Programmable Logic Cluster (PLC), can perform data manipulation operations on 4-bit data or a pair of 4-bit data. Each PLC contains fast carry logic for addition and substraction operations. This carry logic is also used when a PLC is used as a (4-bit) counter. Each PLC can be used as a 16×4 RAM. The routing structure supports 4-bit wide routing.

The existing CAD systems could not exploit the data path capabilities of the second generation FPGA's because these CAD systems were geared toward random logic circuits and could not handle data path circuits well.

SUMMARY OF THE INVENTION

The present invention is an FPGA synthesis system which supports both data path circuits and random logic circuits. It provides users with a set of parameterizable modules so that they can describe a circuit as a collection of those modules. Using the circuit descriptions, the invention will generate technology mapped descriptions for implementation on a particular FPGA using advanced optimization techniques. The mapped circuits can then be placed and routed by existing CAD tools. In describing circuits, users may use either a textual language or a graphics tool. The graphics tool will automatically produce the textual language description of the circuit.

In particular, the present invention will determine how many of the FPGA's logic cells will be used, the function and configuration of each logic cell, and how the individual logic cells are to be connected. The output from the present invention can then be used by other lower level CAD tools for the placement (i.e. where to place each logic cell within the FPGA chip) and routing (i.e. the connections between the individual logic cells).

The present invention has many merits. By way of example, it exploits data path circuits of current FPGA's. It provides users with a higher level of abstraction (than gates and flip-flops) for circuit design. It frees users from architectural details of a particular FPGA and, as a result, it increases productivity of circuit design for the FPGA. Also, it produces high quality results. Other advantages of the present invention will be readily apparent from the detailed description which follows.

DETAILED DESCRIPTION

Figure 1:
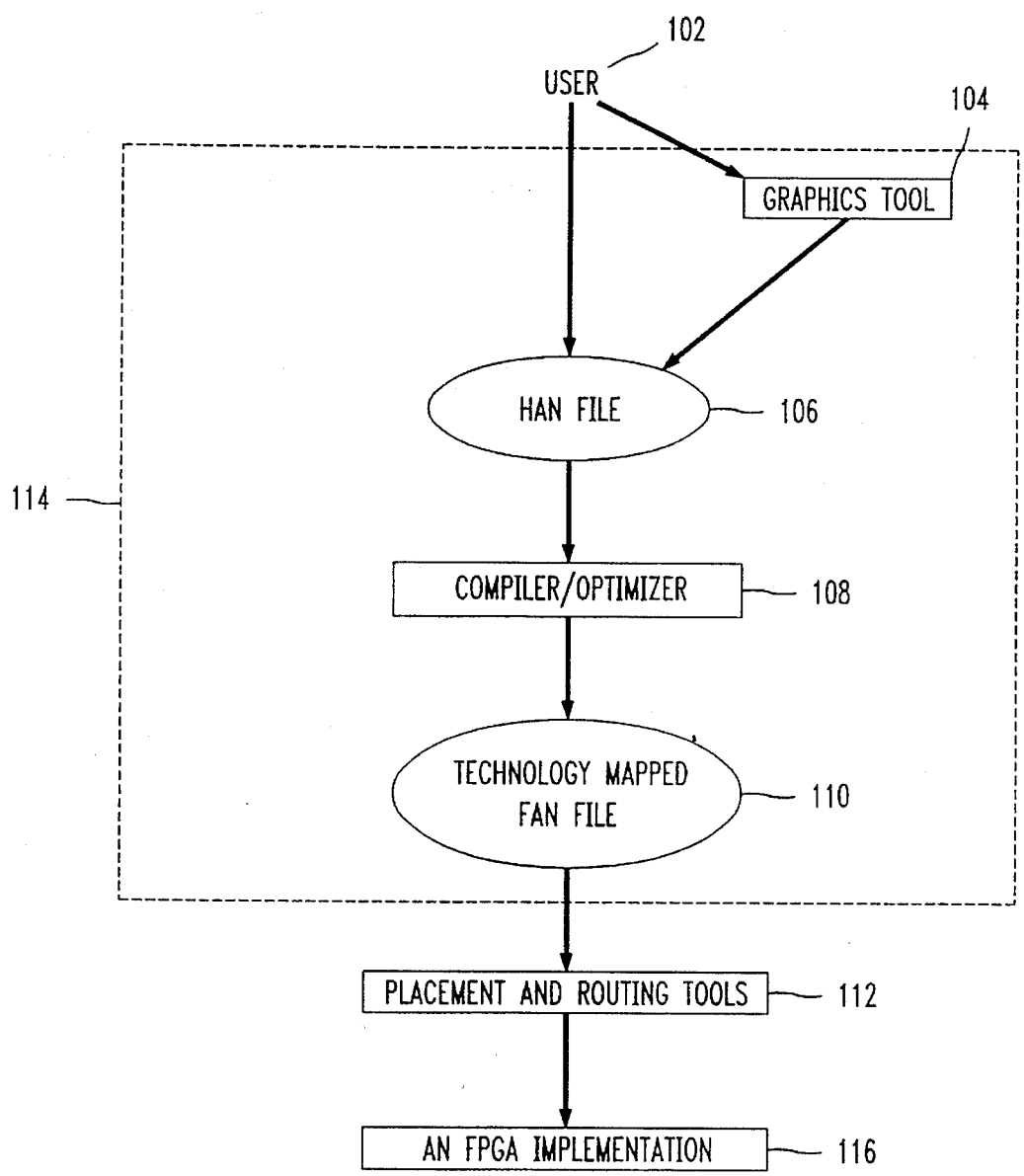
FIG. 1 shows a high level design flow using the present invention.

An overview of a system 114 according to the present invention is shown in FIG. 1. A user 102 interacts with the system by a graphics tool 104 or by entering a high level application netlist (HAN) 106 language description of the circuit directly. A compiler/optimizer 108 generates an FPGA application netlist (FAN) file 110, which is mapped to the specific FPGA technology being used. This FAN file describes the FPGA implementation which was synthesized by the system in a language which is appropriate for the specific CAD system on which the invention is being implemented. The file 110 contains information specifying the number of logic cells being used, the functionality (or configuration) of each logic cell and connection requirement between logic cells. This FAN file 110 is then used as the input to the lower level CAD tools for placement and routing 112. The placement tool determines the location of each logic cell specified in file 110. The routing tool allocates hardware resources in the FPGA chip to satisfy the connection requirement in file 110. These lower level CAD tools will result in the FPGA implementation 116.

Figure 2:
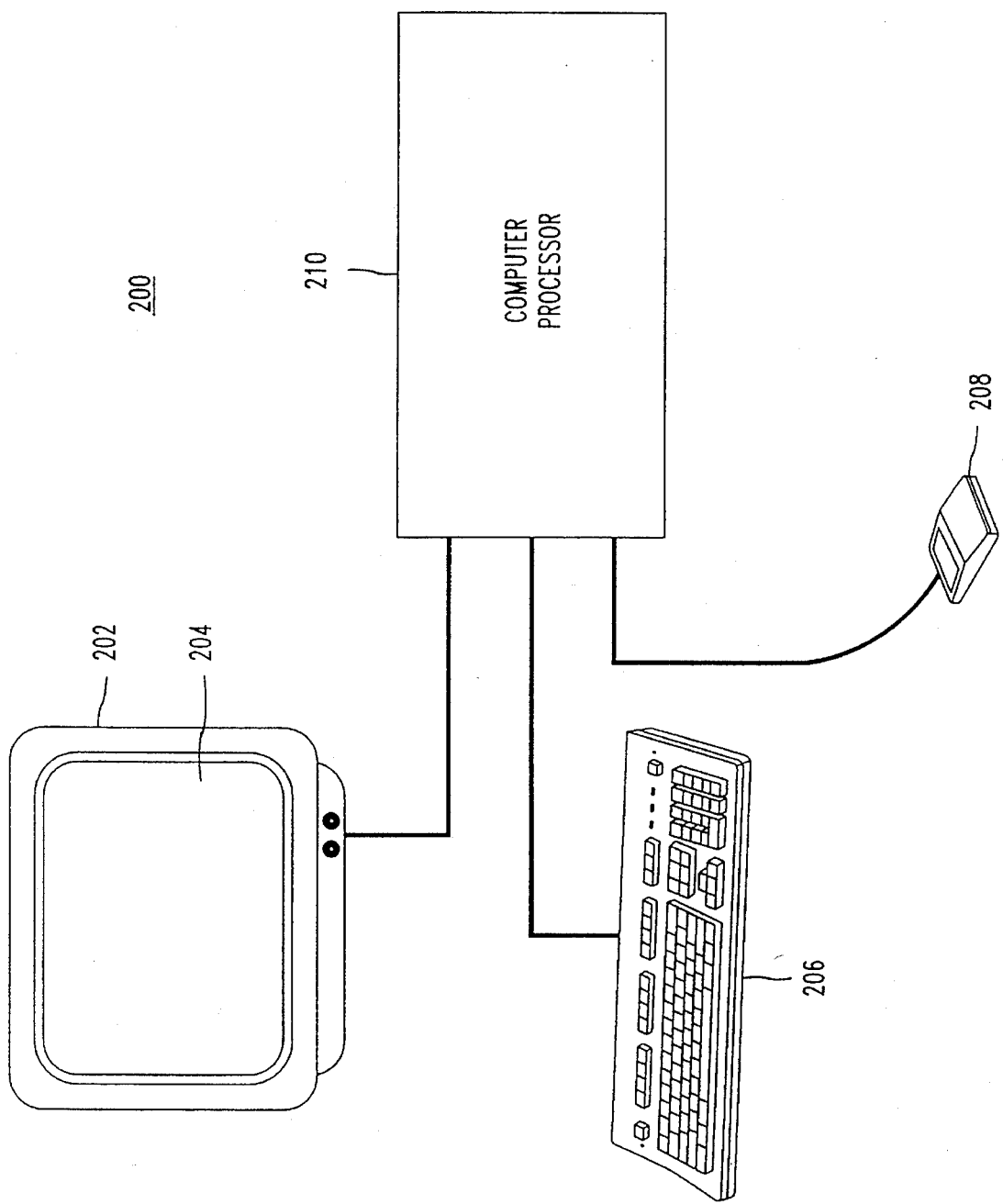
FIG. 2 shows a schematic of the components of the system of the present invention.

One embodiment of the present invention may be implemented using a general purpose computer system such as the one illustrated in FIG. 2. FIG. 2 shows a general purpose computer system 200 comprising a graphical display monitor 202 with a graphics screen 204 for the display of graphical and textual information, a keyboard 206 for textual entry of information, a mouse 208 for the entry of graphical data, and a computer processor 210. In this embodiment of the invention, the computer processor 210 contains program code to implement the invention. The computer processor 210 is connected to the graphical display monitor 202, keyboard 206, and mouse 208. Other graphical entry devices, such as a light pen (not shown), can be substituted for the mouse. This general purpose computer may be one of the many types well known in the art, such as a mainframe computer, a minicomputer, a workstation, or a personal computer.

The invention will be described in four main sections as follows. First, a detailed description of the HAN language will be described in the section entitled TEXTUAL DESCRIPTION OF CIRCUITS. This section will describe the syntax of the language, and will describe how to specify the various circuit components using the language.

The second section is entitled GRAPHICS TOOL. This section will describe the description of circuits using the graphics tool of the present invention instead of describing the circuits directly in the HAN language.

The third section, entitled GENERATING AN FPGA IMPLEMENTATION FROM THE HAN DESCRIPTION, describes the generation of an FPGA implementation from the HAN language description. This section includes a description of the synthesis of circuit components into FPGA implementations. This section also includes a description of the various optimization techniques of the present invention.

The fourth section, entitled CIRCUIT DESIGN USING THE PRESENT INVENTION, gives an example of the design of a simple circuit using the present invention. The example illustrates the use of the HAN language to describe the circuit. The example also illustrates the alternative of using the graphics tool to describe the circuit. The example then shows the synthesis of the various components into an FPGA implementation. This section also illustrates several optimization techniques of the present invention.

TEXTUAL DESCRIPTION OF CIRCUITS

Users may describe the circuits they wish to implement by using the high-level application netlist (HAN) language. Using the HAN language and an input device such as the keyboard 206 of FIG. 2, users may specify a textual description of circuits using parameterized modules. The term parameterized module is used because each circuit component is described as a module and values are given to various parameters to describe the component. This will be clear from the following description of the HAN language.

In HAN, a keyword starts with '.' and all letters in a keyword are either upper-case or lower-case. In addition, every keyword must be the first token of a line.

A signal is an alphanumeric string starting with a character. A signal may contain the underscore ('_') character. A group of signals may be specified by using the form of an array. The syntax of a signal is:

signal::=name!name[num1: num2]

In this description, and those following, the character "!" is used to indicate OR. In the form [num1:num2], both num1 and num2 are integers, where the first number is greater than the second number. For example, the following are valid signals:

a sig_3 mynet[5:0]

In the above example, mynet[5:0] specifies a group of six signals: mynet5, mynet4, mynet3, mynet2, mynet1 and mynet0.

A signal list is a list of signals separated by space(s). The signal list syntax is:

signal_list::=signal!signal signal_list

The following are examples of signal lists.

a a b c mynet[7:0] xyz dout[15:0]

When specifying signals, the leftmost signal corresponds to the most significant bit (MSB) and the rightmost signal corresponds to the least significant bit (LSB).

In HAN, a circuit description starts with .CIRCUIT and ends with .ENDCIRCUIT keywords. In general, a circuit description has the following syntax:

| circuit::= | .CIRCUIT name |
| | preamble |
| | modules_spec |
| | .ENDCIRCUIT |

The preamble description includes up to six fields that describe primary input/output signals, and has the following syntax:

| | |
|---|---|
| preamble::= | .PI signal_list |
| | .PO signal_list |
| | .PC signal_list |
| | .PB signal_list |
| | .PGR signal polarity |

.PI signal_list specifies all primary input signals. .PO signal_list specifies all primary output signals. .PC signal_list specifies all primary clock signals. .PB signal_list specifies all primary bi-directional signals. .PGR signal polarity specifies the global reset signal.

The .PGR field indicates a global reset signal. The field indicates that when the specified signal gets the specified polarity all storage elements will be reset. This global reset is an asynchronous reset. The syntax of the polarity field is Polarity::=HIGH|1|LOW|0. In this polarity syntax, a HIGH specification is the equivalent of specifying "1", and a LOW specification is the equivalent of specifying "0". This polarity syntax applies throughout this description.

If any of the above five preamble fields are not necessary, it can be omitted. For example, if a circuit does not have any primary bi-directional signal the .PB field would not be used.

The modules_spec field of the circuit description describes all the modules in a circuit. It has the following syntax:

modules_spec::=module_spec|module_spec modules_spec

The modules_spec field may be made up of one or more module_spec descriptions. The syntax of a module_spec description is as follows:

| | | |
|---|---|---|
| module_spec :: | = | mem_module_spec \| |
| | | alu_module_spec \| |
| | | compare_module_spec |
| | | mux_module_spec \| |
| | | grp_mux_module spec \| |
| | | reg_module spec \| |
| | | shift_reg_module spec \| |
| | | counter_module_spec \| |
| | | tribuf_module_spec \| |
| | | fsm_module_spec \| |
| | | sub_circuit_module_spec |

The syntax and semantics of each module type are described below.

Memory Module Specification

Users can specify any size of memory through the use of a memory module. Users may also provide initial values of memories. The syntax of a memory module is shown below.

| | |
|---|---|
| mem_module_spec ::= | |
| .MEM | name num_row num_col |
| .ADDR | signal_list |
| .DIN | signal_list |
| .DOUT | signal_list |
| .WREN | signal polarity |
| .TRIEN | signal polarity |
| .INIT | hexa_list |
| .ENDMEM | |
| hexa_list ::= hexa_decimal_number \| hexa_decimal number, hexa_list | |

Except for the .MEM and .ENDMEM fields, the order of fields does not matter.

The .MEM field indicates the beginning of a memory module. It has three arguments. The first argument, name, is a symbol that shows the name of the memory. The second and the third arguments are integers. The second argument, num_row, specifies the number of rows, and the third argument, num_col, specifies the number of columns in the memory. The default values are 16 for the number of rows and 4 for the number of columns.

The .ADDR argument is a list of address signals.

The .DIN and .DOUT fields each have a signal list as its argument. The number of signals in the .DIN and .DOUT fields must be the same as the number of columns of the memory. These fields specify the data in (DIN) and data out (DOUT) signals for the memory module. If the user-defined memory is used as a read only memory (ROM), the .DIN field must be absent.

The .WREN field specifies the write-enable signal, and it has two arguments. The first argument is a symbol that shows the name of the write-enable signal. The second argument specifies the polarity of the signal. If it is 0 or LOW, the write-enable signal is active low; if 1 or HIGH, the signal is active high. The default value of this argument is 1. If this memory is used as a read only memory, there is no need to specify the .WREN field.

The .TRIEN field is used if a user wants tri-state output from memory. This field specifies the control signal of the tri-state buffer(s). The first argument of this field is the name of the control signal, and the second argument is the polarity of the signal. If the control signal has the indicated polarity the memory module produces valid output. Otherwise, the memory module output is in a high impedance state.

The .INIT field is used if a user wants to specify initial contents of a memory. If this field is not specified, the initial value of the memory is unknown. If the number of columns in the memory is less than or equal to 4, a sequence of hexa-decimal numbers is used for the initial values. The values are specified from left to right with the leftmost value being loaded into the highest memory location and the rightmost value being loaded into the lowest memory location. If the width of the memory location is 4 bits, then the binary equivalent of the specified hexadecimal value is loaded into the memory location. For example, the specification:

```
.MEM mem_mod1 10 4
    :
.INIT 2 4 6 8 a b c d e f
.ENDMEM
``` would load the value "2", binary "0010", at location 9, and "f", binary "1111", at location 0.

If the number of columns of the memory is larger than 4, a sequence of parenthesized hexa-decimal numbers is used to specify initial values. In this case, counting of bits is right justified, i.e., 4 bits from the right-end.

For example, in the specification:

```
.MEM mem_mod3 12 7
.INIT
(3,b)(2,a)(1,9)(0,8)(7,7)(6,6)(5,5)(4,4,)(3,3)
(2,2)(1,1)(0,0)
.ENDMEM
``` note that, in each pair, the first hex-digit is for the left (i.e., most significant) three bits and the second hexdigit is for the remaining four bits. The above example would load the binary value "0111011" into location 11, and the binary value "0000000" into location 0.

ALU Module Specification

Users can define ALU modules that perform data manipulation operations on input data. The general format of an ALU specification is as follows:

```
alu_module_spec ::=
    .ALU         name width
    .TYPE        FADD | FSUB | FADDSUB signal
    .AIN         signal_list
    .BIN         signal_list
    .CIN         HIGH | LOW | signal polarity
    .DOUT        signal_list
    .COUT        signal
    .ENDALU
```

Except for .ALU and .ENDALU, fields of an ALU module specification can be in any order.

The .ALU field indicates the beginning of an ALU module. It has two arguments. The first argument, name, is a symbol that tells the name of the ALU. The second argument, width, is an integer that indicates the width of the ALU.

The .TYPE field shows the type of the ALU module. An ALU module can have one of three different types: FADD for adder; FSUB for subtracter; and FADDSUB for adder/subtracter. Users must specify a control signal when they use the FADDSUB ALU type. The ALU will work as an adder when the control signal is "high" or 1; it will become a subtracter when the signal is "low" or 0.

The .AIN and .BIN fields indicate the two inputs of the ALU module. The number of signals in each field must be the same as the width of the ALU module.

The .CIN field describes a carry input signal. Its first argument can be HIGH (for logic 1), LOW (for logic 0) or a signal name. When a signal name is used in the first argument, the second argument specifies the polarity of the signal. If the polarity is 0, the carry input signal is inverted. The default value of the polarity argument is 1.

The .DOUT field describes the output from the ALU module. For an ALU with the subtraction operation, the signals in the DOUT field would have the result of the value of the .AIN signals minus the value of .BIN signals.

The .COUT field indicates the carry output signal from the ALU module.

Compare Module Specification

The syntax of a compare module is as follows:

```
compare_module_spec ::=
    .CMP         name width
    .AIN         signal_list
    .BIN         signal_list
    .OUT         stat_type signal [ polarity ]
    [ .DTYPE     UBIN | 2COMP ]
    [ .IMPL      SUB | LOGIC ]
    .ENDCMP
``` where stat_type::=EQ|GT|GE|LT|LE

The brackets [ ] around the polarity argument in the .DTYPE and IMPL fields indicate that the contents inside the brackets are optional. This use of brackets in module specifications, around field names and arguments, to indicate optional material, is used throughout this specification.

The .CMP field indicates the beginning of a comparator module. The first argument, name, is the name of the module, and the second argument, width, is the width of the comparator module.

The .AIN and .BIN fields show the input signals to the comparator module. The number of signals in each field must be the same as the width specified in the .CMP field.

The .OUT field allows users to describe the status signal. The first argument, stat_type, specifies the type of status signal. There are five types of status signals: EQ (A=B), GT (A>B), GE (A>=B), LT (A<B) and LE (A<=B). The second argument, signal, is the name of the output signal, and the last argument, polarity, is the polarity of the output signal. If the last field is omitted, the active-high polarity is assumed by default.

The .DTYPE field indicates the representation type of input data. The UBIN argument is used for unsigned binary representation, and the 2COMP argument is used for 2's complement representation. If this field is not specified, the input data is assumed to be unsigned binary (UBIN).

The .IMPL field specifies how this comparator will be implemented. The SUB argument indicates that a subtracter will be synthesized for this comparison. If ".DTYPE 2COMP" is used, the system will make use of a subtracter to implement a comparator. The LOGIC argument indicates that a tree of logic circuit will be synthesized. As a result, if ".DTYPE 2COMP" and ".IMPL LOGIC" are used at the same time in one comparator, the system will print an error message. If the .IMPL field is not specified, the synthesizer will make use of subtracters to implement the comparator.

Multiplexer Module Specification

The multiplexer module allows users to specify multiplexers of arbitrary width. The syntax of the multiplexer module is as follows:

```
mux_module_spec ::=
    .MUX         name width
    .SEL         signal_list
    .DIN         number signal
    .DOUT        signal
    .OPT         PERF | AREA
    .ENDMUX
```

The .MUX field indicates the beginning of a multiplexer module. The first argument, name, indicates the name of the multiplexer. The second argument, width, is an integer, and indicates the width of the multiplexer.

The .SEL field specifies selection signals used by the multiplexer. The leftmost signal is the most significant bit.

The first argument of the .DIN field, number, is an integer, and the second argument, signal, indicates an input signal. The first argument indicates the input location of its corresponding data input signal. The number of .DIN fields in one multiplexer module is the same as the width of the multiplexer.

The .DOUT field specifies the name of the output signal of the multiplexer.

The .OPT field indicates the goal of optimization for synthesis. PERF is for performance, and AREA is for area. If PERF is selected, the optimizer will synthesize the fastest FPGA implementation of the multiplexer. If AREA is selected, the optimizer will synthesize a FPGA implementation with the fewest number of components.

Figure 3:
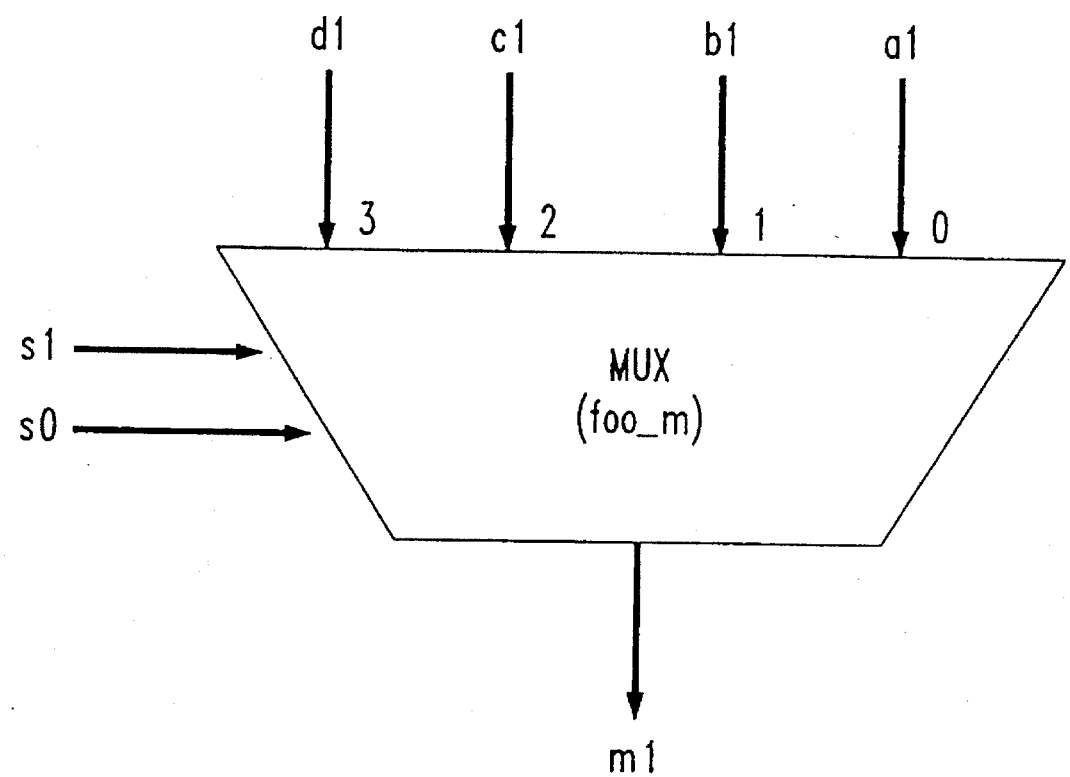
FIG. 3 shows a 4-to-1 multiplexer.

An example of a 4-to-1 multiplexer, named "foo_m", is shown in FIG. 3. This multiplexer is described in HAN as follows:

```
.MUX foo_m 4
.SEL sl        s0
.DIN 3         d1
.DIN 2         c1
.DIN 1         b1
.DIN 0         a1
.DOUT          m1
.ENDMUX
```

Group of Multiplexers

The syntax for the specification of a group of multiplexers is as follows:

```
grp_mux_module_spec ::=
    .GRMUX      name num_mux width_of_one_mux
    .SEL        signal_list
    .DIN        number signal_list
    .DOUT       signal_list
    .OPT        PERF | AREA
    .ENDGRMUX
```

The .GRMUX field indicates the beginning of a multiplexer-group module. The first argument, name, is the name of the module, the second argument, num_mux, is the number of multiplexers in this group. The last argument, width_of_one_mux is the number of inputs of each multiplexer. All component multiplexers have the same width.

The .SEL field indicates selection signals of a component multiplexer.

The .DIN field specifies the data input signals to the multiplexers. There must be N .DIN fields, where N is the width of a component multiplexer. The first argument, number, is the number indicating input position. The second argument, signal_list, is a list of signals each of which is connected to the specified input position of each component multiplexer. There must be M signals in the list, where M is the number of multiplexers in the group.

The .DOUT field indicates output signals from all component multiplexers. There must be M signals in the argument.

The .OPT field indicates the optimization goal when this group of multiplexer is synthesized. PERF is for performance, and AREA is for area.

Figure 4:
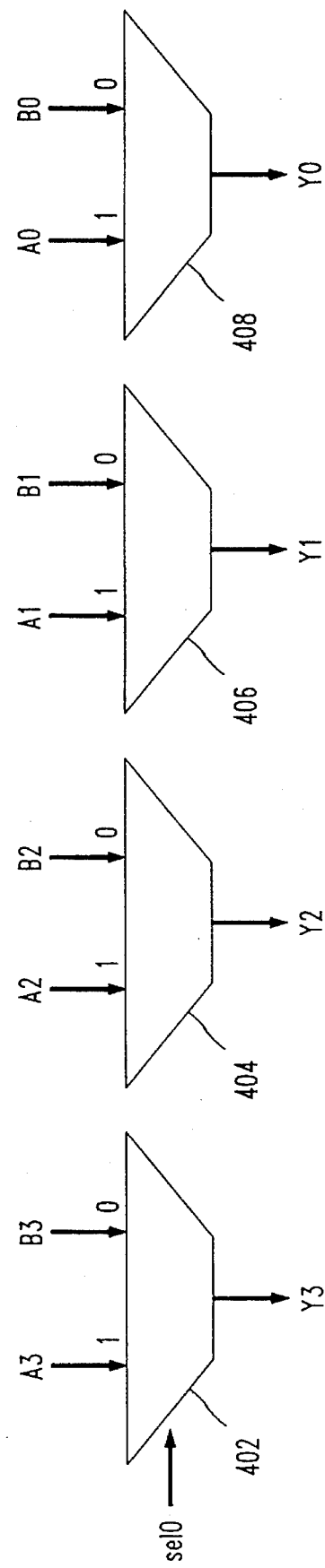
FIG. 4 shows a multiplexer group consisting of four 2-to-1 multiplexers.

One example of a multiplexer group, named "foo_g", consisting of four 2-to-1 multiplexers, is shown in FIG. 4. All four multiplexers 402, 404, 406, 408 share the same selection signal, "sel0". This multiplexer is described in HAN as follows:

```
.GRMUX foo_g 4 2
.SEL sel0
.DIN 1        A[3:0]
.DIN 0        B[3:0]
.DOUT         Y[3:0]
ENDGRMUX
```

Register Module Specification

Users can specify registers of arbitrary width. They can also select the clocking scheme of registers. The following is the format for register module specification:

```
reg_module_spec ::=
    .REG        name width
    .CK         clock_mode clock_signal [clock_enable_signal
                polarity]
    .DIN        signal_list
    .DOUT       signal_list
    [ .RESET    reset_mode_reset_signal_reset_value ]
    .ENDREG
```

Except for .REG and .ENDREG fields, the order of fields does not matter.

The .REG field indicates the beginning of a register module. The first argument, name, specifies the name of the register module. The second argument, width, specifies the width of the register module.

The .CK field specifies the clock of this register. The first argument, clock_mode, shows the clocking mode. The syntax of this argument is as follows:

clock_mode::=LEVEL_HIGH|LEVEL_LOW|EDGE_HIGH|EDGE_LOW

LEVEL_HIGH indicates the register is level sensitive, and clock is active high. LEVEL_LOW indicates the register is level sensitive, and clock is active low. EDGE_HIGH indicates the register is edge triggered at the rising edge of the clock. EDGE_LOW indicates the register is edge triggered at the falling edge of the clock.

The second argument, clock_signal, indicates the name of the clock signal. The third argument, clock_enable_signal, specifies the signal used as the clock-enable. If this argument is ignored, the clock is always enabled. The last argument, polarity, specifies the polarity of the clock_enable signal. If this is not specified, the clock_enable signal is active-high by default.

The .DIN field specifies a list of input signals to the register. The .DOUT field specifies a list of output signals from the register.

The .RESET field shows the reset mechanism of the register. The first argument, reset_mode, specifies the reset mode, and its syntax is:

reset_mode::=SYNC_HIGH|SYNC_LOW|ASYNC_HIGH|ASYNC_LOW

SYNC_HIGH indicates synchronous reset when the reset signal is high. SYNC_LOW indicates synchronous reset when the reset signal is low. ASYNC_HIGH indicates asynchronous reset when the reset signal is high. ASYNC_LOW indicates asynchronous reset when the reset signal is low.

The second argument, reset_signal, specifies the reset signal. The last argument, reset_value, is a string of bits (0 or 1) that specifies the value of the register when it is reset. The leftmost bit is for the MSB and the rightmost bit is for the LSB. If the reset_value is not specified, a default value of all 0's is used.

Shift Register Module Specification

Users can specify shift registers of arbitrary width. The following is the format for specifying a shift register module.

```
shift_reg_module_spec ::=
    .SHREG              name width
    [.TYPE              LOGIC | ARITH | CIRCULAR ]
    .DIR                RIGHT|LEFT|BIDIR signal
    [.PLOAD             load_signal polarity signal_list ]
    [.MSBIN             HIGH|LOW|signal ]
    [.LSBIN             HIGH|LOW|signal ]
    [.DOUT              signal_list ]
    [.MSBOUT            signal ]
    [.LSBOUT signal ]
    .CK clock_mode_clock_signal [ clock_enable_signal polarity]
    [ .RESET reset_mode reset_signal reset_value ]
    .ENDSHREG
```

The .SHREG field indicates the beginning of a shift register module. It has two arguments. The first, name, indicates the name of the shift register module. The second, width, specified the width of the shift register module.

The .TYPE field specifies the type of the shift register module. The following table shows the operation of a shift register of each type. (For an N bit register, bit N−1 is the MSB and bit 0 is the LSB.)

| Type | Shift Right | Shift Left |
|---|---|---|
| LOGIC | MSB <- MSB input signal or 0 | LSB <- LSB input signal or 0 |
| | Bit i <- Bit(i + 1) | Bit i <- Bit(i - 1) |
| ARITH | MSB is unchanged. | MSB is unchanged. |
| | (MSB - 1) <- MSB | LSB <- 0 |
| | Bit i <- Bit(i + 1) | Bit i <- Bit(i -1) |
| CIRCULAR | MSB <- LSB | LSB <- MSB |
| | Bit i <- Bit (i + 1) | Bit i <- Bit (i - 1) |

The .DIR field specifies the direction (i.e., right or left) of shift. If the argument specifies RIGHT, then the register is shift right only. If the argument specifies LEFT, then the register is shift left only. If the argument specifies BIDIR, then the shift direction is determined by the value of the signal. If the signal value is HIGH or 1, it is shift right; otherwise, shift left.

The .PLOAD field describes parallel load information. The first argument, load_signal, indicates a LOAD signal. The second argument, polarity, indicates when the loading operation takes place. The third argument, signal_list, is a list of parallel input signals. For example, if polarity is HIGH, the shift register gets the value of the parallel input signals when the LOAD signal is high and the clock signal is activated. Note that the number of signals in the third argument must be the same as the width of the shift register.

The .MSBIN field indicates either HIGH, LOW, or the serial input signal to the most significant bit position. If the type of shift register is LOGIC and if shift direction is RIGHT, the MSB of the shift register will have the value HIGH, LOW, or the value of the specified signal after a clock. If this field is not specified, the value 0 is used as a serial input.

The .LSBIN field indicates either HIGH, LOW, or the serial input signal to the least significant bit position. If the type of the shift register is LOGIC and if shift direction is LEFT, the LSB of the shift register will have the value HIGH, LOW, or the value of the specified signal after a clock. If this field is not specified, value 0 is used as a serial input.

The .DOUT field shows parallel output signals of the shift register. The number of signals in the argument must be the same as the width of the shift register.

The .MSBOUT field indicates the signal name of the MSB of the shift register. The .LSBOUT field indicates the signal name of the LSB of the shift register. A shift register module must have at least one of .DOUT, .MSBOUT or .LSBOUT fields.

The .CK field specifies the clock of this register. The first argument, clock_mode, shows the clocking mode. The user may choose one of two modes: EDGE_HIGH indicates the register is edge triggered at the rising edge of the clock; and EDGE_LOW indicates the register is edge triggered at the falling edge of the clock. The second argument, clock_signal, indicates the name of the clock signal. The third argument, clock_enable_signal, specifies the signal used as clock-enable. If this argument is ignored, the clock is always enabled. The fourth argument is the polarity of the clock-enable signal.

The .RESET field indicates the reset mechanism of the register. This field is as described in connection with the register module.

Counter Module Specification

Users can specify up-, down-, or up/down counters of various widths. They can also specify a parallel loadable counter. The following is the format for a counter module specification.

```
counter_module_spec ::=
    .COUNTER       name width
    .CTYPE         UP | DOWN | UPDOWN signal
    .PLOAD         load_signal polarity signal_list
    .DOUT          signal_list
    .COUT          signal
    .CK            clock_mode clock_signal
                   [clock_enable_signal
                   polarity ]
    .RESET         reset_mode
                   reset_signal
                   [reset_value ]
    .ENDCOUNTER
```

The .COUNTER field indicates the beginning of a counter module. The first argument, name, indicates the name of the counter module. The second argument, width, indicates the width of the counter module. The .CTYPE field indicates the type of the counter. The counter may be an UP counter, a DOWN counter, or an UPDOWN counter. If the UPDOWN type is specified, the last argument of this field specifies the control signal that controls the direction of the counter module. If the signal is 0, the counter is an UP counter; if the signal is 1, the counter is a DOWN counter. If UP or DOWN type is used, the last argument is skipped.

The .PLOAD field represents the parallel-load capability of the counter. If this field is not included, the counter does not load parallel input data. The first argument, load_signal, indicates the load control signal. The second argument, polarity, indicates the effective polarity of the load control signal. The last argument, signal_list, is a list of signals that are connected to load inputs. When the load and clock signals are activated, the counter gets its values from the list of signals.

The .DOUT field specifies a list of output signals from the counter. The .COUT field specifies the carry output signal from the counter. The carry signal will be high during the clock period in which all outputs are '1'.

The .CK field specifies the clock of a counter module. This field is as described in connection with the register module.

The .RESET field specifies the reset mechanism of the counter. This field is as described in connection with the register module.

Tri-state Buffer Specification

Users can specify tri-state buffers. The following is the syntax for specifying a set of tri-state buffers.

```
tribuf_module_spec ::=
    .TBUF name number
    .ENABLE signal polarity
    .DIN signal_list
    .DOUT signal_list
    .ENDTBUF
```

The .TBUF field indicates the beginning of a tri-state buffer module. The first argument, name, indicates the name of the tri-state buffer module. The second argument, number, indicates the number of buffers in the tri-state buffer module.

The .ENABLE field describes the enable signal of the buffer(s). The first argument, signal, indicates the name of the enable signal. The second argument, polarity, specifies whether the tri-state buffer is active high or active low. The default value of the polarity argument is 1.

The .DIN field describes the data input signals of the buffers. The .DOUT field describes the data output signals of the buffers.

Finite State Machine Specification

Users can specify finite state machines. The syntax for specifying a finite state machine is:

```
fsm_module_spec ::=
    .FSM          name
    .IN           signal_list
    .COMBOUT      signal_list
    .REGOUT       signal_list
    .STATE        state_list
    .CK           clock_mode      clock_signal
    .RESET        reset_mode      reset_signal     reset_state
    .EQS          number_of_entries
                  /* one equation per line */
                  /* each equation has var = expression
                     format */
    .TRANS        number_of_entries
                  /* one transition specification per line */
                  /* each transition specification has the */
                  /* format of */
                  /* state1 state2 expression */
    .ENDFSM
```

The .FSM field indicates the beginning of a finite state machine module. Its argument, name, is the name of the FSM.

The .IN field describes the input signals of the FSM. Clock and reset signals must not be included here.

The .COMBOUT field specifies the output signals that are produced by the FSM, but are not registered by extra flip-flop(s). In general, output signals from FSMs belong to this category.

The .REGOUT field indicates output signals of this FSM that must be registered. That is, an additional flip-flop (other than those for the finite state machine) must be used for each output signal of this type.

The .STATE field shows the names of states of the FSM. Only flip-flops are used to implement states of FSMs. The .STATE field must appear before .RESET, .EQS and .TRANS fields. A state name must be unique in a circuit or sub-circuit description.

The .CK field describes the clock signal and its type. The clock_mode and clock_signal fields are as described in connection with the register module.

The .RESET field shows the reset signal and the reset state of the FSM. The reset_mode and reset_signal are as described in connection with the register module. The reset state indicates the state of the FSM when it is reset. When the reset_signal is activated, the finite state machine will go to the state specified as reset_state.

The .EQS field contains a set of Boolean equations, one per line. Each Boolean equation has the format of:

Variable=Expression

Equations in this field may specify output variables of this FSM. They can also specify temporary variables being used in the FSM. The detailed format of the equation is described below (in "Boolean Equation Specification" section).

The .TRANS field contains a set of state transition functions, one per line. Each state transition has the following format:

present_state next_state expression

Figure 5:
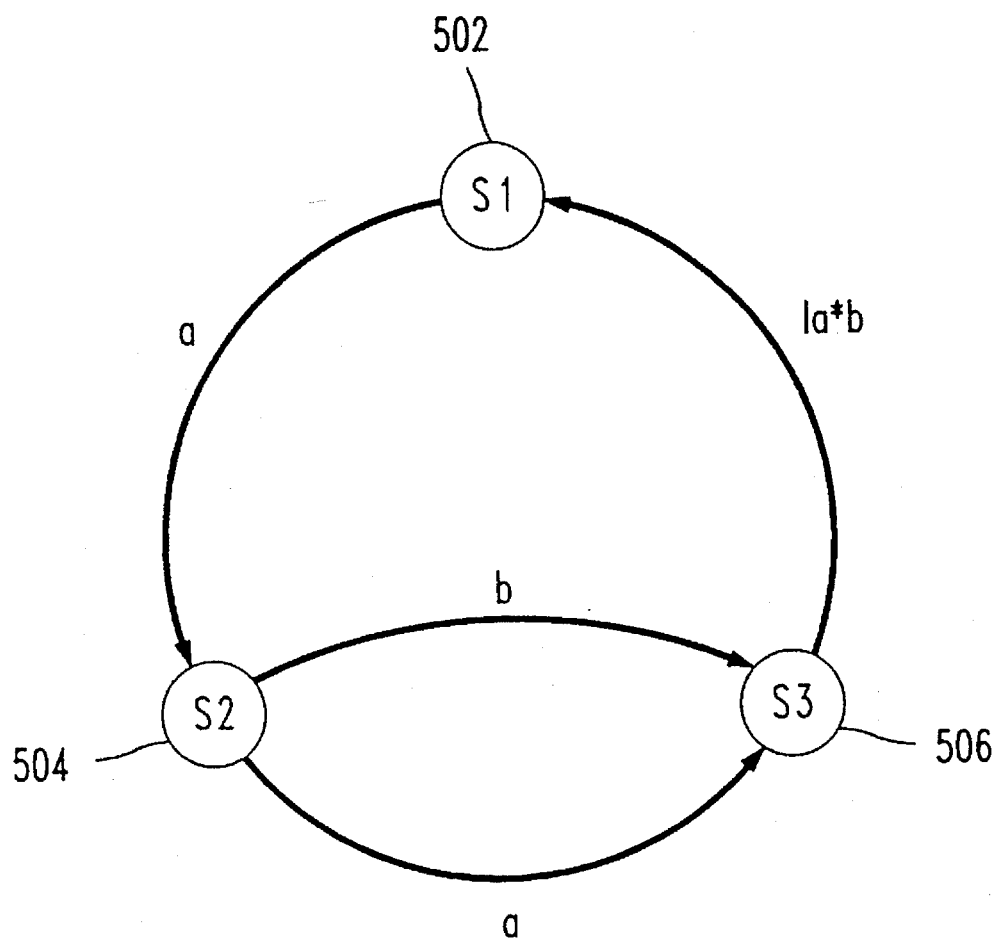
FIG. 5 shows a finite state machine state graph.

For example, consider an FSM with three states (S1 502, S2 504 and S3 506) as shown in FIG. 5. The machine has two input signals, a and b. The state transition of the machine is represented as follows:

| .TRANS 4 | | |
|---|---|---|
| S1 | S2 | a |
| S2 | S3 | b |
| S3 | S2 | a |
| S3 | S1 | !a*b |

Random Logic Description

In addition to data path modules, users can also specify random logic in the HAN language. Users may specify combinational functions and flip-flops.

The syntax for a random logic circuit description is:

random_logic_spec::=bfunc_spec!ff_spec

A Boolean function may be specified with Boolean equations or Cube format.

The syntax for a Boolean function specification is:

bfunc_spec::=bfunc_eq!bfunc_cube

Boolean Equation Specification

If the user wants to specify a boolean function using boolean equations, the format is:

bfunc_eq::=.BEQ signal=expression

The following operators are supported for boolean expressions.

| Symbol | Meaning |
|---|---|
| ! | logical negation |
| & * | logical and |
| \| + | logical or |
| ^ % | logical exclusive-or |

Parenthesis can be used to change the order of evaluation.

For instance, to describe a logical AND gate with three inputs (a, b and c) and one output (y), the following boolean equation is used:

.BEQ y=a*b*c

Cube Specification

If the user wants to specify a boolean function using CUBE format, the format is:

```
bfunc_cube ::=
    .CUBE             signal
    .IN               signal_list
    .TBL
    /* Cube content one per line */
    .ENDCUBE
```

The .CUBE field indicates the beginning of the CUBE module. The argument, signal, indicates the output signal.

The .IN field indicates the input signals.

The .TBL field describes the boolean function. The number of columns in the table is the number of input signals plus one. Each column represents a corresponding input signal. For example, a "1" in the first column of the table represents the active state of the first input signal. A "0" represents the inactive state of the signal. The last column in each row indicates the output signal with the specified combination of input signals. There may be more than one row in the table. Each row indicates a combination of active and non-active states of the input signals and the corresponding state of the output signal.

For example, to describe a logical AND gate with three inputs (a, b, and c), and one output (y), the following CUBE format is used.

```
.CUBE        y
.IN          a b c
.TBL
111          1
.ENDCUBE
```

Specifying Flip-Flops

The invention supports the following construct to represent a flip-flop.

```
ff_spec ::=
    .FF          name
    .DIN         signal
    .DOUT        signal
    .CK          clock_mode clock_signal
                 [clock_enable_signal
                 enable_polarity ]
    .RESET       reset_mode reset_signal
                 reset_value
    .ENDFF
```

The .FF field indicates the beginning of a flip-flop specification. Its argument is the name of the flip-flop.

The .DIN field specifies the input signal to the flip-flop. The .DOUT field specifies the output signal of the flip-flop.

The .CK field specifies the clock of the flip-flop. This field is as described in connection with the register module.

The .RESET field shows the reset signal and the reset value of the flip-flop. The reset_mode and reset_signal fields are as described in connection with the register module. The reset_value indicates the state of the flip-flop when it is reset.

The .ENDFF field indicates the end of the flip-flop description.

Subcircuit Specification

Users can make use of sub-circuits in a circuit specification, thereby allowing hierarchical description of circuits. The following is the syntax of specifying a sub-circuit.

```
sub_circuit_module spec ::=
    .SUBCKT name
    .REFNAME name
    .IN signal_list
    .OUT signal_list
    [.BI signal_list ]
    [.CK signal_list ]
    .ENDSUBCKT
```

The .SUBCKT field indicates the beginning of a sub-circuit module. Its argument tells the name of the sub-circuit module.

The .REFNAME field shows the name of the actual circuit that is referred to by this subcircuit. Its argument is the name of the referred circuit.

The .IN field shows a list of input signals to the sub-circuit. These signals are matched to primary input signals of the referred circuit based on position.

The .OUT field indicates a list of output signals from the sub-circuit. Again, these signals are matched to primary output signals of the referred circuit based on position.

The .BI field describes a list of bidirectional signals to/from the sub-circuit. These signals are matched to primary bidirectional signals of the referred circuit based on position.

The .CK field shows clock signal(s) to the sub-circuit. As before, these signals are matched to primary clock signals of the referred circuit based on position.

The above sub-circuit definition allows users to have a hierarchical description of their application circuits.

GRAPHICS TOOL

As an alternative to entering circuit descriptions using the HAN language, users may describe circuits using a graphics tool. The graphics tool will translate a user's graphical description of a circuit into the HAN language.

Figure 6:
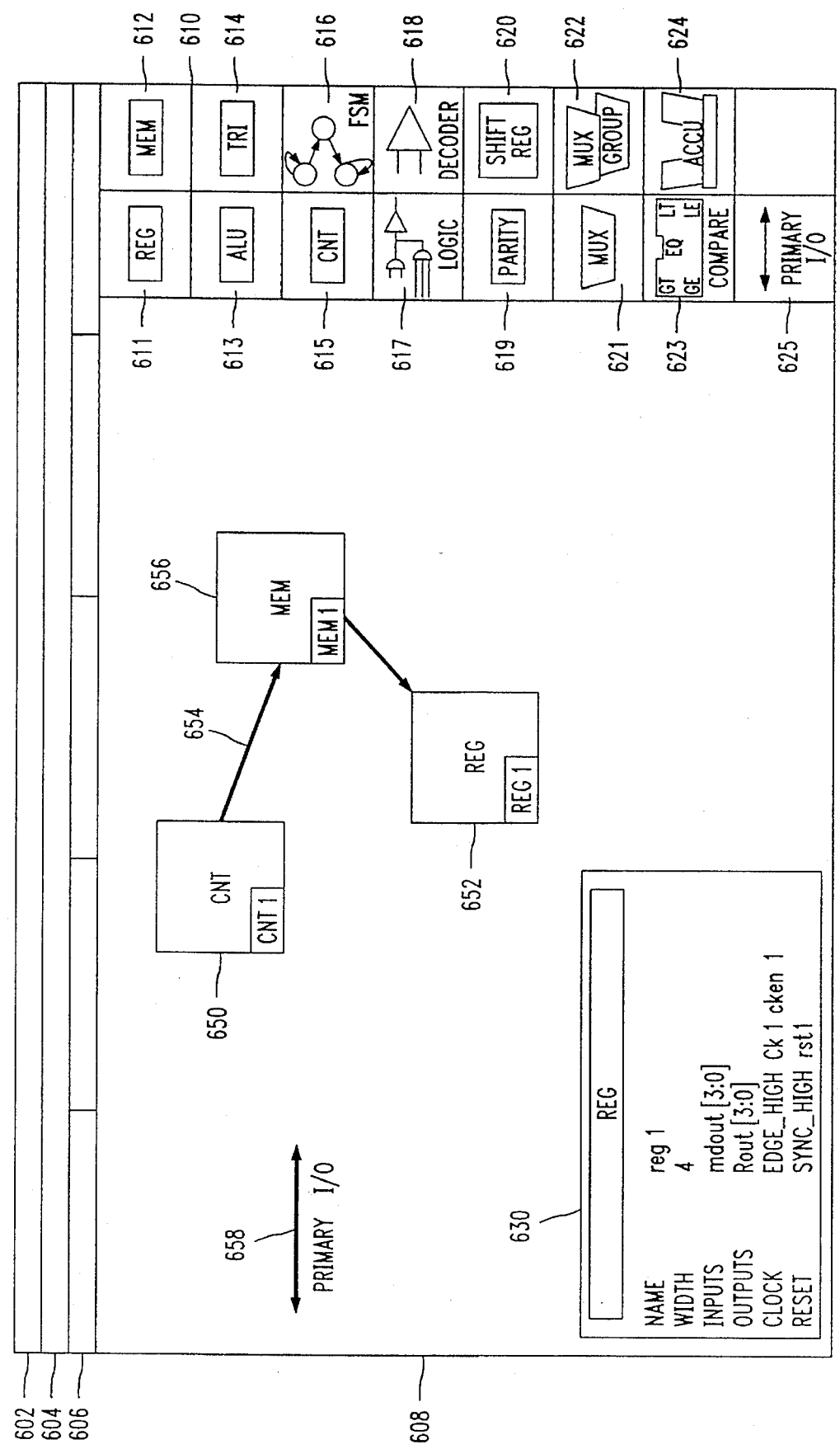
FIG. 6 shows a screen display of the graphics tool.

The graphics tool is a window type environment. The graphics tool displays a window type editor on the graphical display screen. As shown in FIG. 6, the layout of the window 600 consists of three horizontal bands at the top 602, 604, 606, a relatively large canvas area below the three bands on the left side of the tool 608, and a smaller panel area below the three bands on the right side of the tool 610. The panel area contains several icons representing design elements (or modules) such as a register 611, a memory 612, an ALU 613, a tri-state buffer 614, a counter 615, a finite state machine 616, logic 617, a decoder 618, parity 619, a shift register 620, a multiplexer 621, a multiplexer group 622, a comparator 623, an accumulator 624, and primary I/O 625.

The horizontal band 602 located at the top of the window is the title area. This area indicates the tool's name.

The horizontal band 604 below the title area 602 is the message area. The message area informs users of the status of operations which they requested of the graphics tool. For example, if a user executes a request to save the work done on the screen into a file, the message area will display a message indicating whether the operation was successful or not. If a user selects an object from the canvas area 608, the message area will display the type of that object (e.g. register, ALU, etc.).

The third horizontal band 606 is the pulldown menu bar. This area consists of several rectangular regions with text inside. These regions may be command buttons. Positioning the mouse glyph on top of one of these and pressing the mouse button will cause the action indicated by the text to occur immediately. Other regions may be pulldown menus. Positioning the mouse glyph on top of one of these and pressing the mouse button will cause a menu to drop down. Dragging the glyph over one of the menu selections will cause that selection to darken. If the mouse button is released, the action associated with the selection will be taken.

The larger rectangular region below the pulldown menu bar is the canvas area 608. This is where the user will do design work.

In order to add a design element using the graphics tool, first, the element to be added is selected by positioning the mouse glyph on an icon in the panel area 610 and pressing the mouse button. Whichever was selected becomes the current design element. The second step is to place the element on the canvas area 608. This is done by positioning the mouse glyph somewhere in the canvas area 608 and pressing the mouse button. The selected design element will appear in the canvas area. Any combination of elements may be used to construct the circuit. Any element may be repositioned on the canvas area by positioning the mouse glyph over that icon, pressing the mouse button and dragging the icon to a new position. When the mouse button is released, the element will remain in the new position. Elements may be deleted by pressing the DELETE key on the keyboard, moving the mouse glyph over the element to be deleted, and pressing a mouse button. The item will disappear.

Once design elements have been placed into the canvas area 608, attributes may be assigned to them. For example, a REGISTER may be a design element, and 4-bit width might be an attribute which has been chosen for the register. The input and output signals are also attributes which may be assigned to design elements. The first step in this process is to select the element whose attributes are to be edited by positioning the mouse glyph on the element of interest and double-clicking the mouse button. A message is displayed in the message area 604 indicating which type of item has been selected. Next, the edit function is selected from the appropriate menu on the pulldown menu bar 606.

A multibox 630 will appear with various fields for which the user may specify values. This box will be different depending on the type of element. A multibox for a Register module is shown at 630. The multibox prompts the user for the attributes of the selected design element. In the example shown, the multibox prompts the user for the register attributes Name, Width, Inputs, Outputs, Clock and Reset. These attributes correspond to the fields and arguments required in the HAN language description of a register module. For each predefined design element, a corresponding multibox will be used to enter the attributes of that design element. Attributes may be added to all the chosen design elements in this manner.

If the input to one element is the output of another, the graphics tool will automatically draw a directed arc between them indicating this data dependency. For example, in FIG. 6, the output of CNT1 650 is an input to MEM1 656. The graphics tool automatically displays a directed arc 654 on the screen to indicate this relationship.

Figure 7:
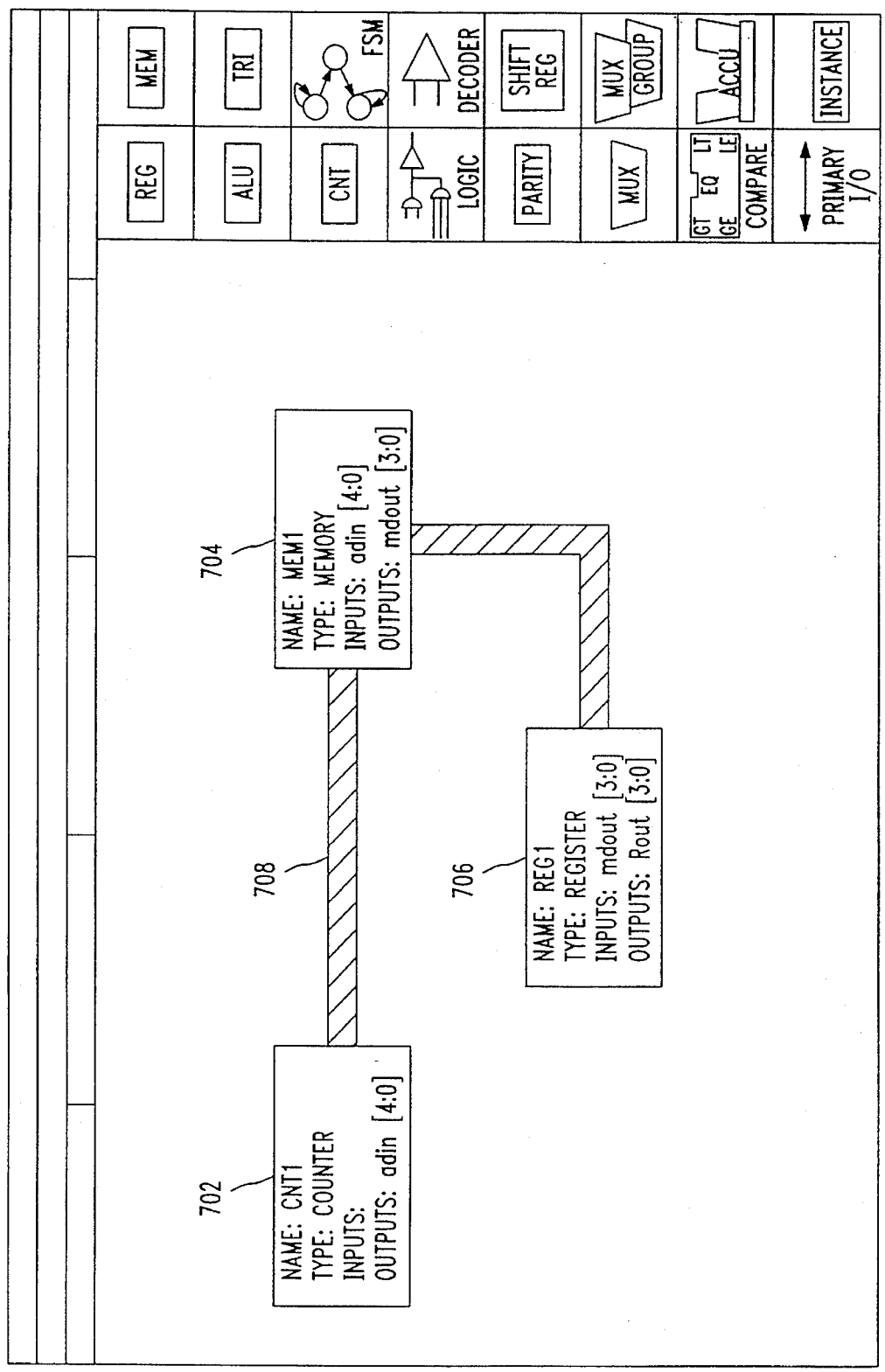
FIG. 7 shows an alternative screen display of the graphics tool.

If the user prefers to see a more informative view of elements which has the name, inputs, and outputs, the user may select the appropriate command from the pulldown menu bar. This will display the design elements as shown in FIG. 7. For example, in this view, COUNTER CNT1 is shown as a box 702 including information on the name, type, inputs, and outputs of the element. A similar view is displayed for MEMORY MEM1 704 and REGISTER REG1 706.

Users may also change the form of the connecting lines between design elements. By choosing an appropriate command from the pulldown menu, the user may change the form of the connecting lines from the directed arc 654 shown in FIG. 6, to the undirected (wide) line 708 as shown in FIG. 7.

FIGS. 6 and 7 will be discussed in more detail in connection with the example circuit discussion in the section entitled CIRCUIT DESIGN USING THE PRESENT INVENTION.

Figure 8:
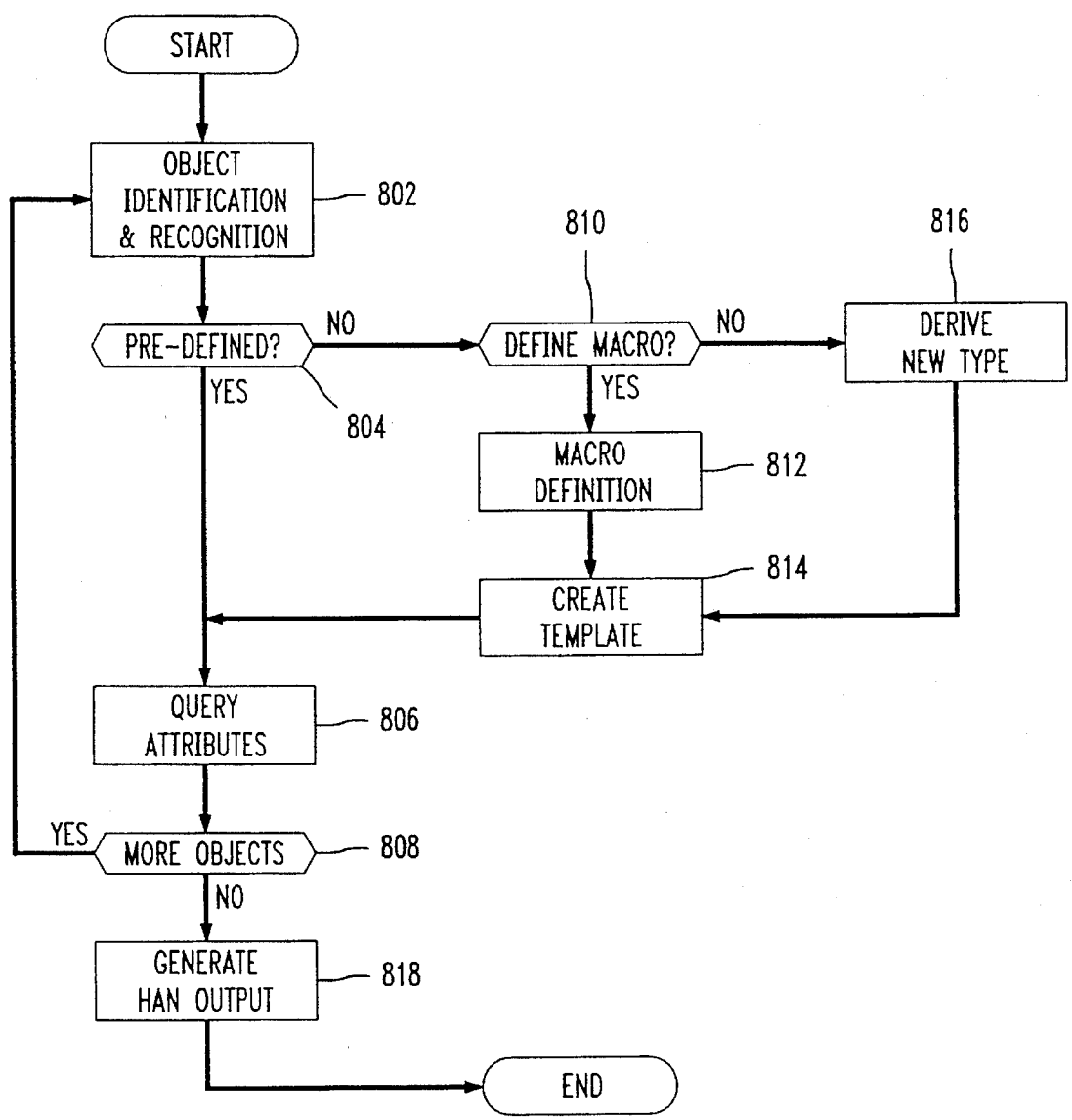
FIG. 8 shows an end user flow diagram for the graphics tool.

In using the graphics tool, a designer may not only use pre-defined elements, but may also define a macro from a collection of elements, or may derive a new object from the pre-defined elements. If the designer chooses to define a new element, a new icon may be created. The macro definition and object derivation aspects of the invention are described in connection with FIG. 8.

When the designer chooses a design element icon step 802, the graphics tool determines whether the object chosen is a pre-defined design element in step 804. If it is pre-defined, the system asks the designer for the attributes of the design element in step 806, as described above. If it is determined in step 808 that there are more objects in the design, the system returns to step 802 and the designer may add more elements to the design.

If the element chosen by the designer is not predefined, the system determines whether the user wants to define a macro or derive a new design element in step 810. If the designer wishes to define a macro, the system continues to step 812. A designer can group a collection of design elements and call them a macro, which can then be used in a design. Arbitrary fields in the underlying design elements can be tagged as either constant or variable. If tagged as variable, when the object is chosen for use in a design, the multibox requesting attributes will request attributes for these variables. If an attribute is tagged as constant, a value is assigned to the attribute during macro definition step 812 and no field appears for it in the multibox. After the user has defined the macro, a template is created in step 814. This defined macro can then be used by the designer as any other pre-defined design element. The system will then query the variable attributes for this macro as used in the current design in step 806.

If the element chosen by the designer is not predefined, the user may derive a new type of design element in step 816. The graphics tool permits the derivation of new object types from the already provided atomic types. For example, an ALU is a system-defined atomic type. It defines several parameters which can be set by the designer including width and type (e.g. adder, subtracter, etc.). A designer who frequently uses an 8-bit adder can "derive" a new object from the ALU type with the type parameter set to adder and the width set to 8. After the designer has defined the new design element, a template is created in step 814. A unique icon can be associated with this derived type and the designer can henceforth use it as a pre-defined object. When the designer chooses to use this new type, the multibox which queries attributes will request attributes for all of the parameters normally associated with the ALU object except for the type and width fields. It is a unique capability of the interface to allow the object-oriented concept of object derivation to be extended to the end-user via a graphical interface.

The notion of derived design elements implies the creation of a design element hierarchy. Element derivation is a powerful concept because it employs the notion of attribute inheritance. Since a derived design element inherits all of the parameters and attributes of its parent design element, it permits the creation of a custom design-element library with less work, in many cases, than the macro approach.

When the designer has completed the design using the graphics tool, the result of condition 808 will be "N" and the system will translate the graphical representation of the circuit into the HAN language in step 818. This HAN language is then used as the input to the compiler/optimizer.

GENERATING AN FPGA IMPLEMENTATION FROM THE HAN DESCRIPTION

The compiler/optimizer reads input in the HAN format and produces technology-mapped FPGA descriptions. The operations of the compiler/optimizer will be explained in connection with the ORCA FPGA of AT&T, discussed above. However, the techniques described below can be adapted to other FPGA chips from other manufacturers, and the ORCA FPGA chip is being used here for illustrative purposes only.

Functionality of one PLC of ORCA FPGA

Figure 9:
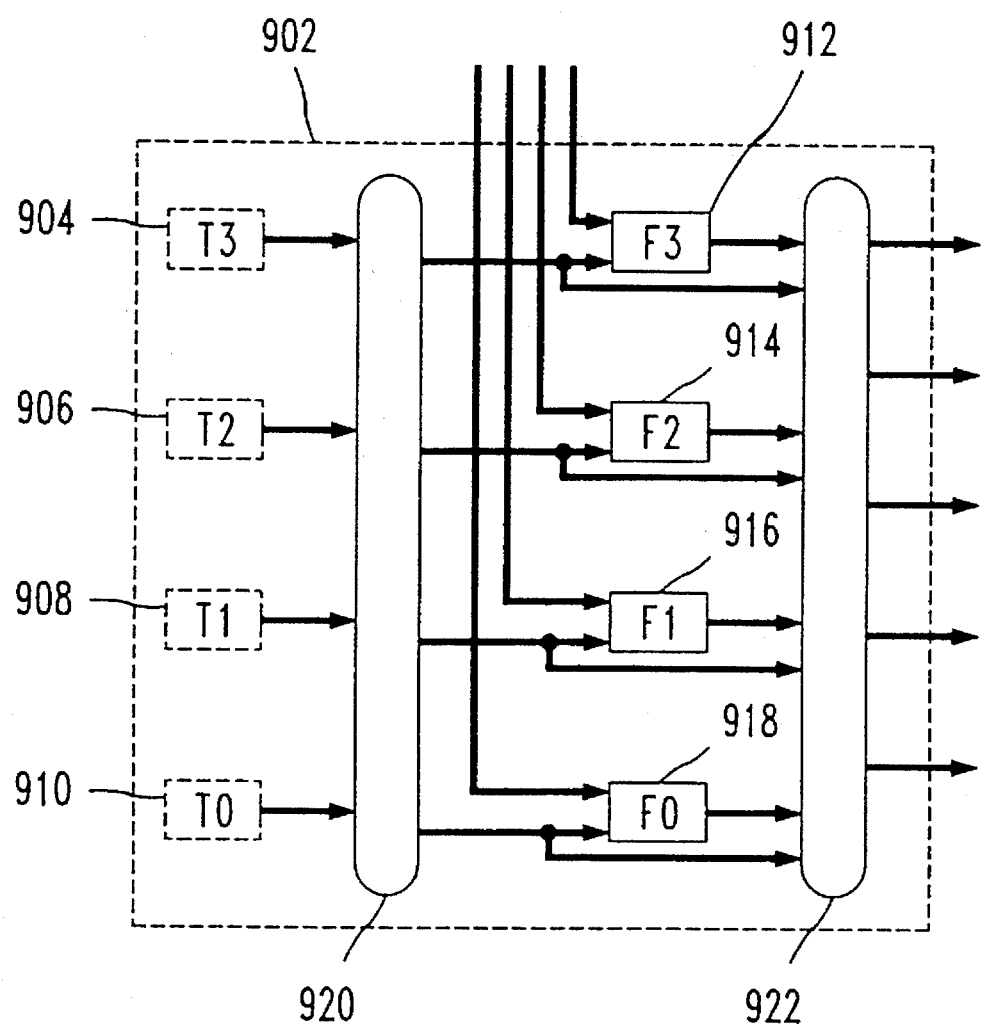
FIG. 9 shows a block diagram of the ORCA FPGA programmable logic cluster.

As discussed above, a logic cell of the ORCA FPGA is called a programmable logic cluster (PLC). There are hundreds of PLC's in one ORCA FPGA chip. As shown in FIG. 9, one PLC, 902, contains four lookup tables (LUTs) 904, 906, 908, 910, each of which is a 16-bit static RAM (random access memory). It also contains four (edge-triggered) flip-flops 912, 914, 916, 918 which can also be configured as (level-sensitive) latches. A PLC also contains configurable connection blocks, 920 and 922.

One PLC of ORCA FPGA can implement the following circuits: one 16×4 memory, or two 16×2 memories; a 4-bit adder or subtracter or adder/subtracter; a 4-bit counter up, down, up/down, parallel load; a 4-bit register; a 4-bit tri-state buffers; and certain logic circuits. One PLC can implement certain combinations of the above functions.

For each user-defined module, the compiler/optimizer will produce an optimized design including configured PLC's and the connections among the PLC's, as explained below. The resulting design is also called a netlist of PLC's.

Figure 10:
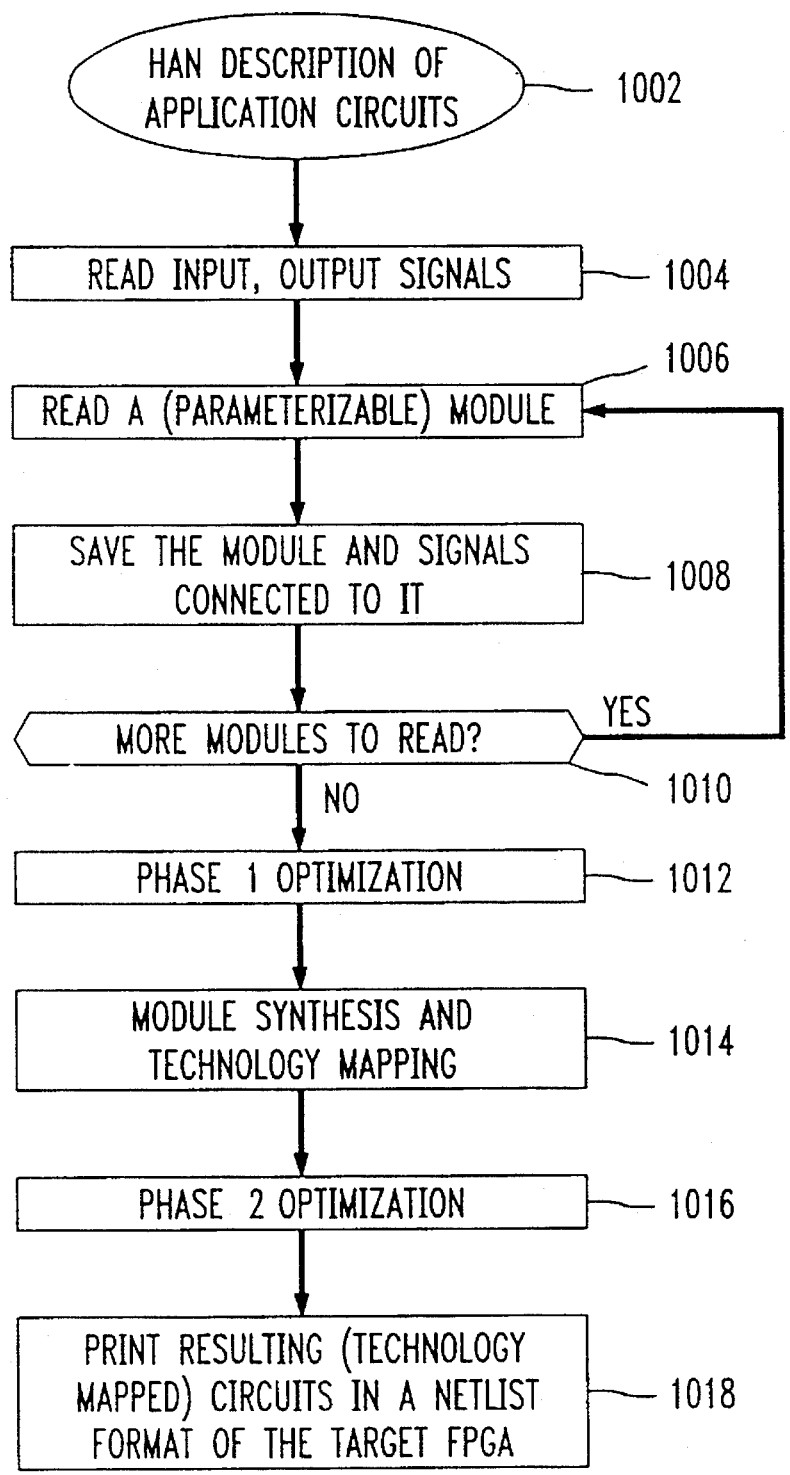
FIG. 10 shows a flow diagram of the compiler/optimizer.

A flow diagram of the operation of the compiler/optimizer is shown in FIG. 10. The HAN description represented at 1002, which is created by either entering the HAN language textually, or by using the graphics tool to create the HAN language, is read by the compiler/optimizer. The compiler/optimizer first reads the input/output signals from the HAN description in step 1004. The compiler/optimizer then reads a parameterized module in step 1006, and saves the module and the signals connected to it in step 1008. If there are more modules to read from the HAN description then the result of condition 1010 is yes and the compiler/optimizer will read the next parameterized module in step 1006. This process continues until there are no more modules to be read. When all modules have been read, the compiler/optimizer performs phase 1 optimization step 1012.

Phase One Optimization

Figure 11:
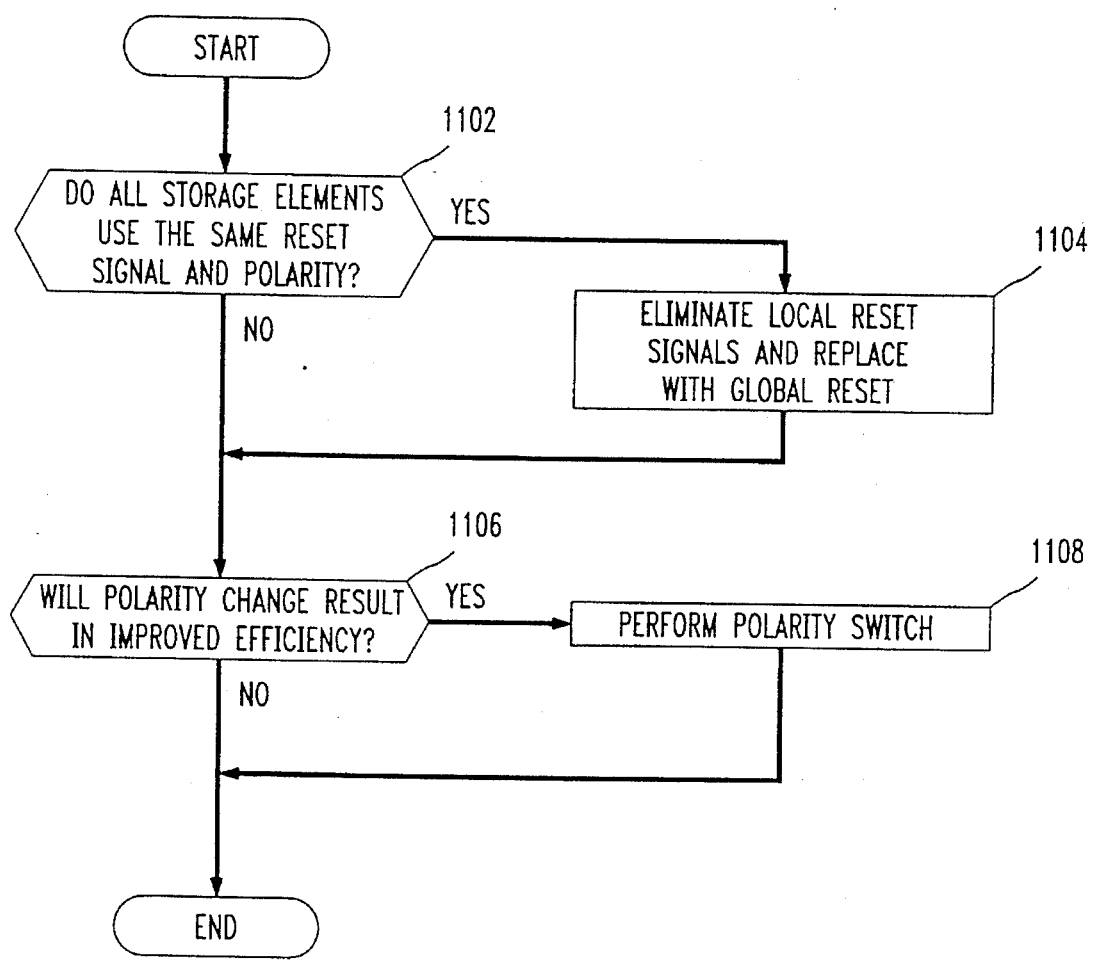
FIG. 11 shows a flow diagram of phase 1 optimization.

Phase 1 optimization will be described in connection with FIG. 11. First, all storage elements in a circuit (e.g. registers, shift-registers, counters, finite state machines, and subcircuits) are analyzed in step 1102. If all the storage elements in a circuit use the same asynchronous reset signal and if the polarity of the reset signals are the same, then the local reset signals are replaced by a global (chip-wide) reset signal of the FPGA Chip in step 1104. With respect to finite state machines, if a finite state machine has a starting state and if the starting state is triggered by an asynchronous reset signal, the optimizer/compiler adds the reset signal to the preset port of a flip-flop corresponding to the starting state.

Figure 12:
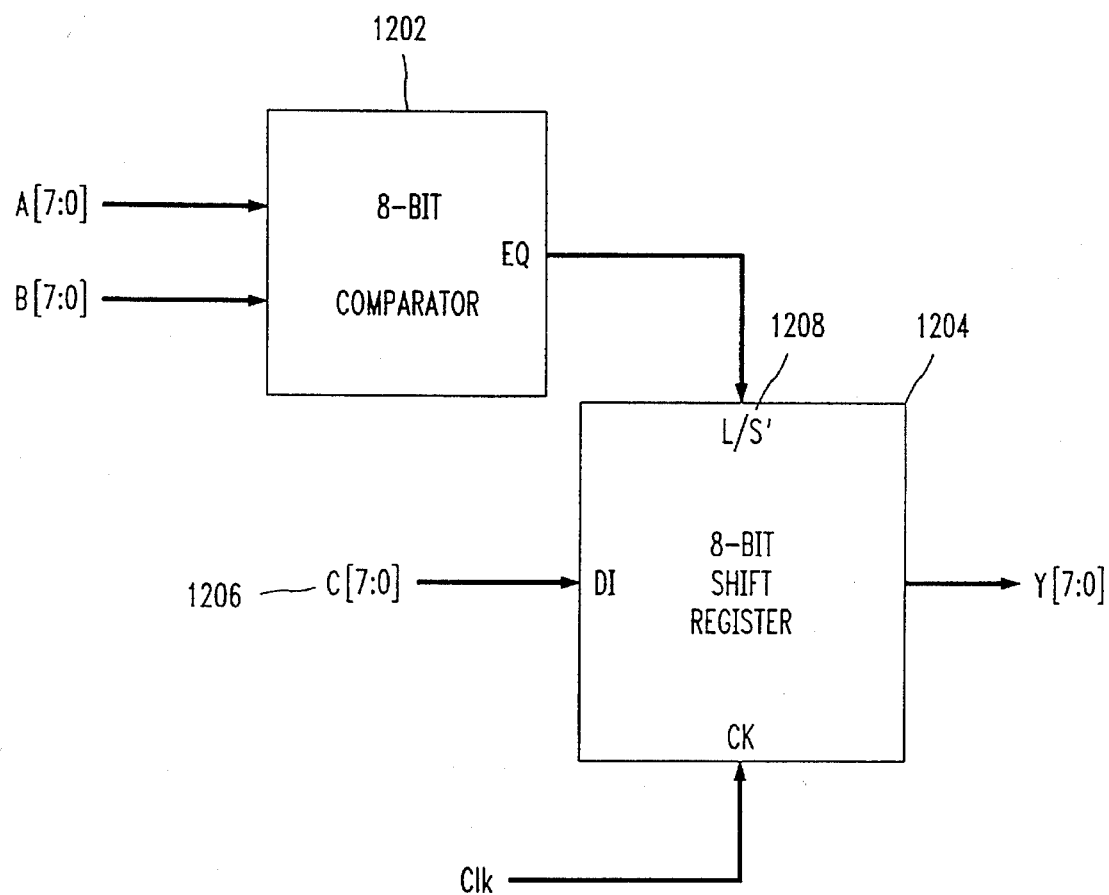
FIG. 12 illustrates the benefits of optimization by changing signal polarities.

The optimizer/compiler next checks signal polarities of adjacent modules in step 1106 and changes the polarities in step 108 if such charges result in more efficient implementation. For example, consider the circuit in FIG. 12, which contains an 8-bit comparator 1202 and an 8-bit shift register 1204. The shift register 1204 loads its input data C[7:0] 1206 if its L/S' signal 1208 is high; it shifts its contents when the signal is low. Using AT&T's ORCA FPGA, an 8-bit equality checker can be implemented using two PLC's if the equal output is active-low. If the output is active-high an inverter must be added, which results in an additional PLC. In this case, the optimizer/compiler would change the polarity of the L/S' signal 1208 of the shift register 1204 to active-low, and it will synthesize the shift register accordingly. As a result, one less PLC would be required to implement the circuit.

Referring back to FIG. 10, after the phase 1 optimization step 1012 is complete, the next step 1014 is module synthesis and technology mapping. In this step, each module which is described in the HAN language is synthesized into one or more PEC's of the FPGA.

Module Synthesis
Compiling Memory Modules

Figure 13B:
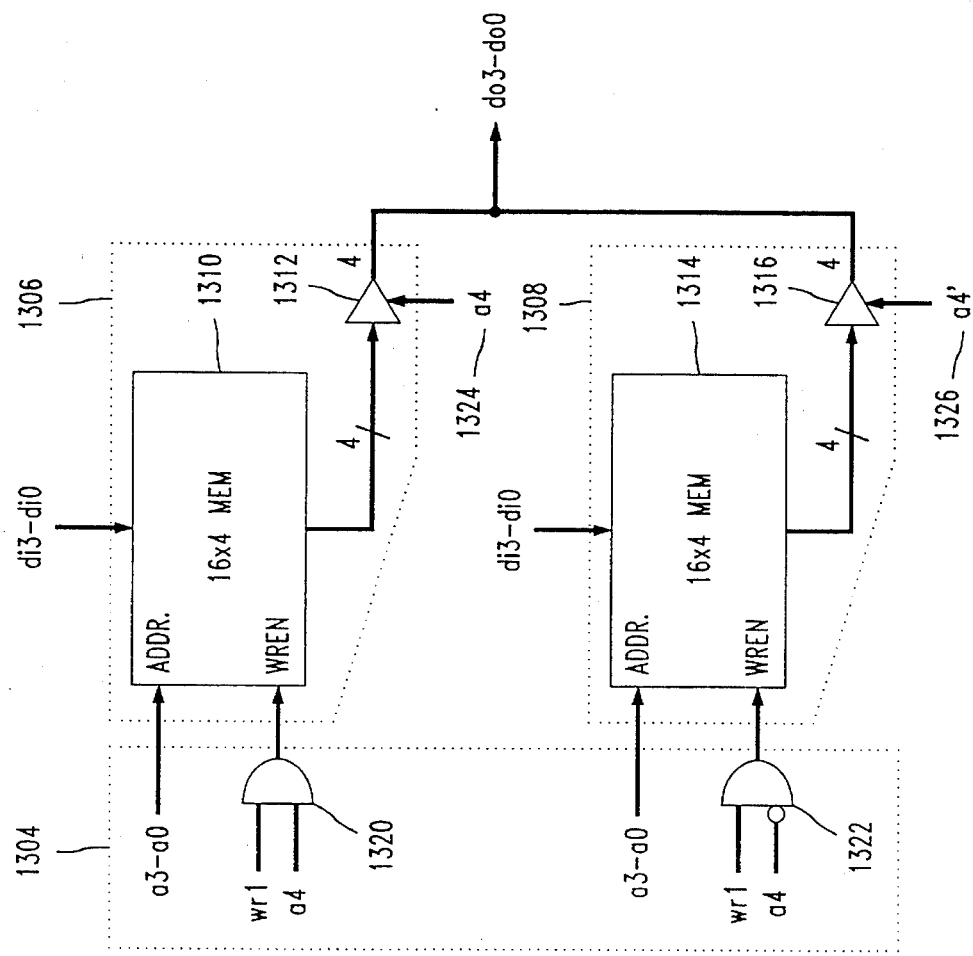
FIG. 13B shows a compiled circuit of the user defined 32×4 memory of FIG. 13A.
Figure 13A:
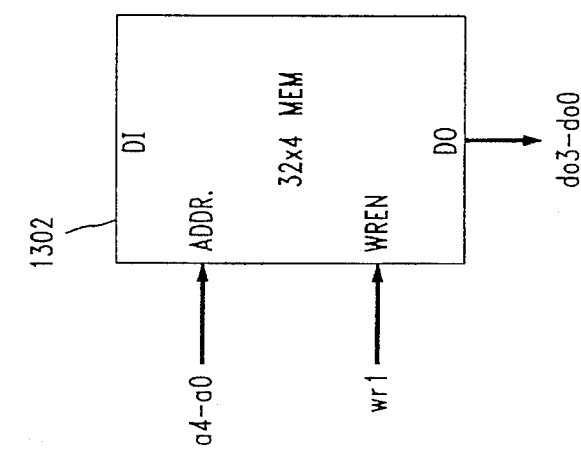
FIG. 13A shows a user defined 32×4 memory.

The optimizer/compiler compiles each user-defined memory to one or more PLC's. If the total number of rows of a user-defined memory is larger than 16, the optimizer/compiler introduces an address decoding circuit and tri-state buffers. For example, consider a user-defined memory of 32 rows and 4 columns as shown in FIG. 13A as 1302. This memory module must be split into two 16×4 memory units for ORCA FPGA implementation because, as discussed above, each PLC can implement one 16×4 memory. The optimizer/compiler produces a compiled circuit as shown in FIG. 13B, and allocates three PLCs 1304, 1306, and 1308 for the circuit. One 16×4 memory 1310 and four tri-state buffers 1312 are assigned to PLC 1306, and one 16×4 memory 1314 and four tri-state buffers 1316 are assigned to PLC 1308. Two gates 1320 and 1322 are assigned to PLC 1304. Note that the optimizer/compiler makes use of programmable polarity of tri-state enable signals in ORCA's PLC. For the PLC implementing the upper half memory 1306, it uses an active-high a4 signal 1324. For the PLC implementing the lower half memory 1308, it uses an active-low a4' signal 1326.

Compiling ALU and Counter Modules

Figure 14B:
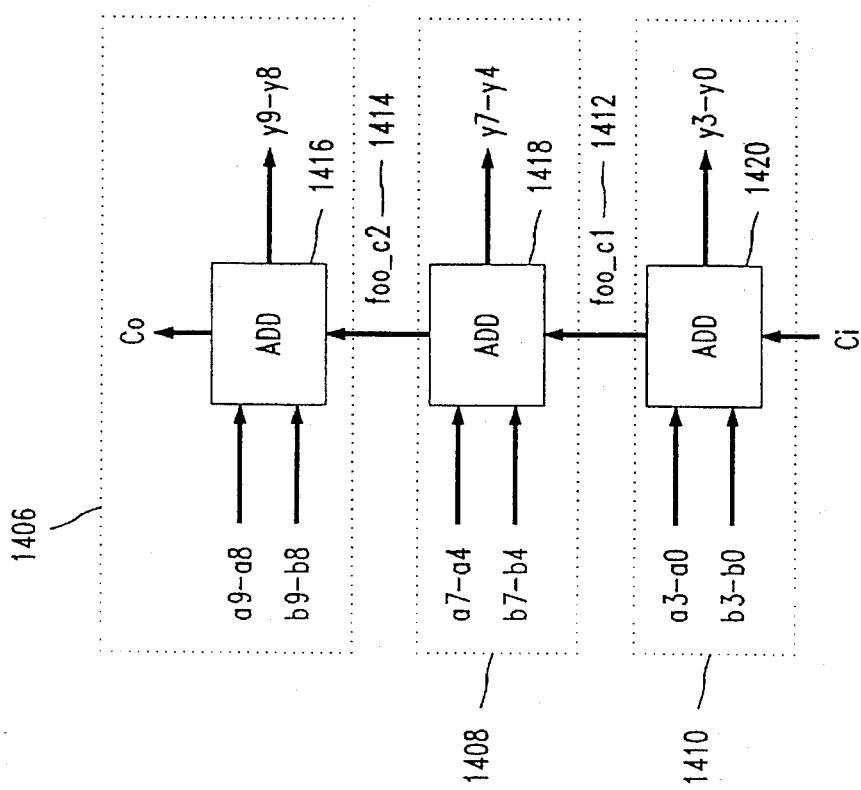
FIG. 14B shows a compiled circuit of the user defined 10-bit adder of FIG. 14A.
Figure 14A:
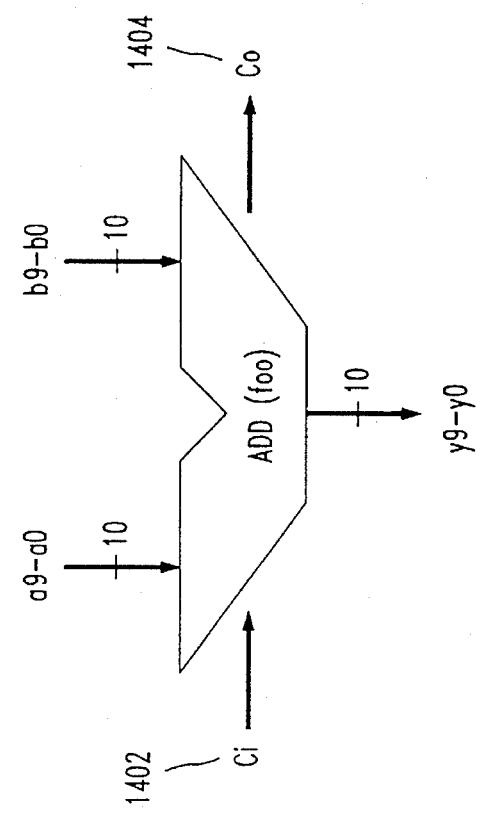
FIG. 14A shows a user defined 10-bit adder.

The optimizer/compiler compiles each user-defined ALU into one or more PLCs. If the width of a user-defined ALU is larger than 4, the optimizer/compiler introduces carry signals between PLC's. As an example, consider a 10-bit user-defined adder shown in FIG. 14A. The name of the adder is "foo", and it has the Ci signal 1402 as its carry input, and Co signal 1404 as its carry output. It has 2 10-bit inputs (a9–a0 and b9–b0) and one 10-bit output (y9–y0). For this circuit, the optimizer/compiler produces a three PLC 1406, 1408, 1410 implementation as shown in FIG. 14B. PLC 1406 implements a 2-bit adder 1416 and PLC's 1408 and 1410 each implement one 4-bit adder 1418, 1420. Adder 1416 has two 2-bit inputs, (a9–a8 and b9–b8) and one 2-bit output (y9–y8). Adder 1418 has two 4-bit inputs (a7–a4 and b7–b4) and one 4-bit output (y7–y4). Adder 1420 has two 4-bit inputs (a3–a0 and b3–b0) and one 4-bit output (y3–y0). The optimizer/compiler introduces two new carry signals between the PLC's: foo_c1 1412 and foo_c2 1414.

The optimizer/compiler would implement counters in a similar manner and would introduce intermediate carry signals.

Figure 15A:
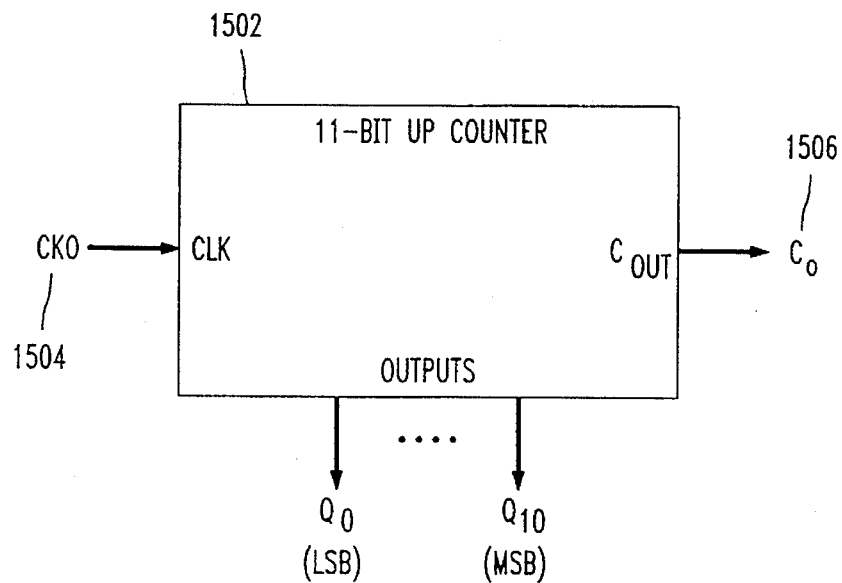
FIG. 15A shows an 11-bit counter.

In addition, the optimizer/compiler introduces a new reset circuit if necessary. Consider, for example, an 11 bit counter 1502 shown in FIG. 15A. It is clocked by CKO signal 1504; it has $C_0$ 1506 as its carry output signal, and $Q_{10}$, $Q_9$, $Q_8$, $Q_7$, $Q_6$, $Q_5$, $Q_4$, $Q_3$, $Q_2$, $Q_1$, $Q_0$ as data output signals.

Figure 15B:
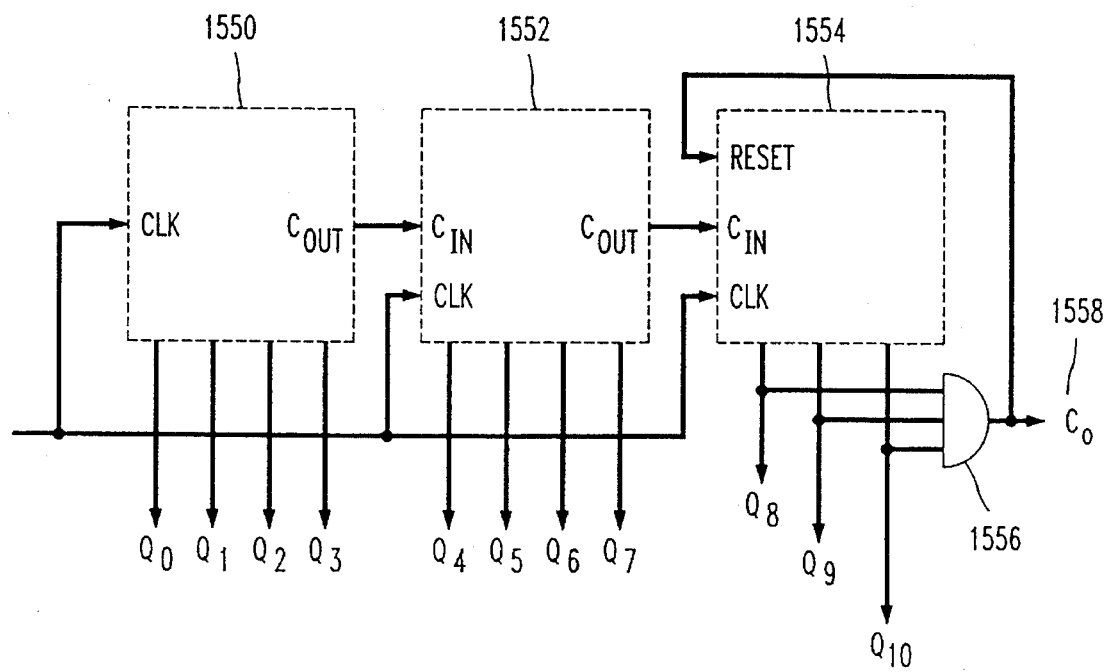
FIG. 15B shows an implementation of the 11-bit counter shown in FIG. 15A.

Since one PLC of ORCA FPGA can implement a 4-bit counter, the optimizer/compiler allocates three PLC's 1550, 1552, 1554 as shown in FIG. 15B. In addition, it introduces a new circuit, a 3-input AND gate 1556, whose input comes from $Q_8$, $Q_9$ and $Q_{10}$ of 1554. The output of the AND gate is used as a (synchronous) reset signal of the most significant counter 1554. It is also used as a carry output signal $C_0$ 1558.

Compiling Multiplexer Modules

Figure 16A:
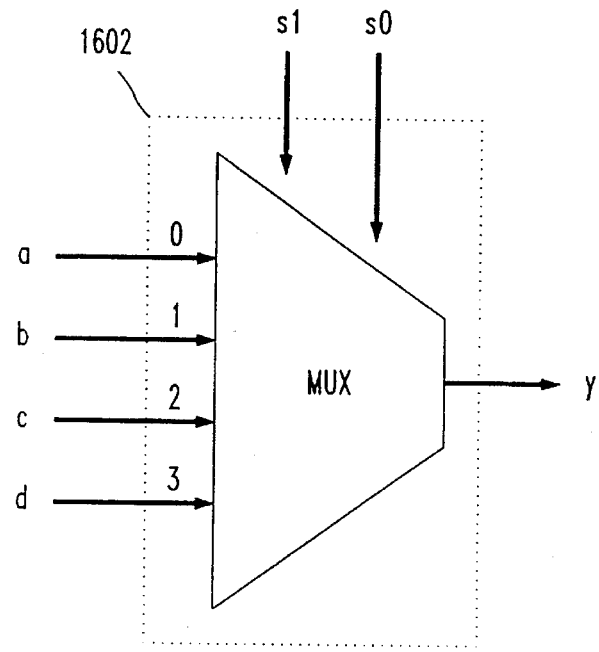
FIG. 16A shows the implementation of a 4-to-1 multiplexer in one logic cell with 4 16-bit lookup tables.
Figure 16B:
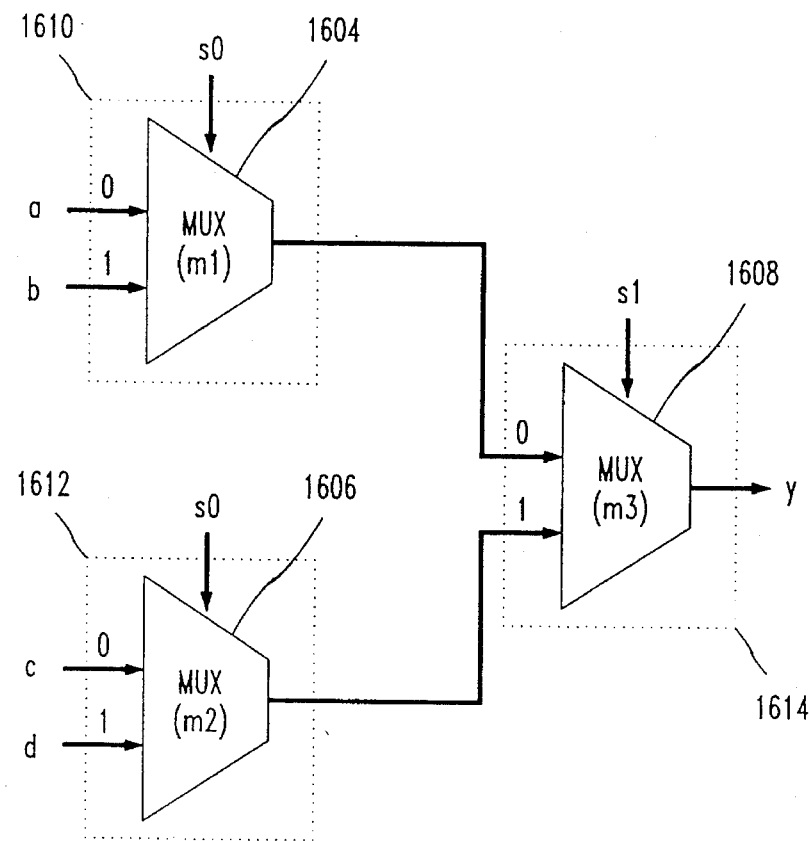
FIG. 16B shows the implementation of a 4-to-1 multiplexer in three logic cells using three 16-bit lookup tables.

The optimizer/compiler compiles each user-defined multiplexer into lookup table(s). Consider, for example, a 4-to-1 multiplexer as shown in FIG. 16A. The multiplexer has four input signals (a, b, c, and d) and two selection signals (s1 and s0). Since, the total number of inputs of the multiplexer is 6, the optimizer/compiler allocates all four lookup tables in one PLC 1602 (i.e., 64-bit RAM in total) to implement the multiplexer. Alternatively, the optimizer/compiler could allocate only three lookup tables for the multiplexer. This is shown in FIG. 16B. Each 2-to-1 multiplexer 1604, 1606, 1608 is implemented by one 16-bit lookup table. This three PLC 1610, 1612, 1614 implementation would result in more signal delay than the implementation in FIG. 16A. The optimizer/compiler would implement the 4-to-1 multiplexer according to the user's request represented in the .OPT field of the multiplexer module specification.

If PERF was chosen, then the optimizer/compiler would implement the 4-to-1 multiplexer as shown in FIG. 16A. If AREA was chosen, the optimizer/compiler would implement the 4-to-1 multiplexer as shown in FIG. 16B.

Figure 17:
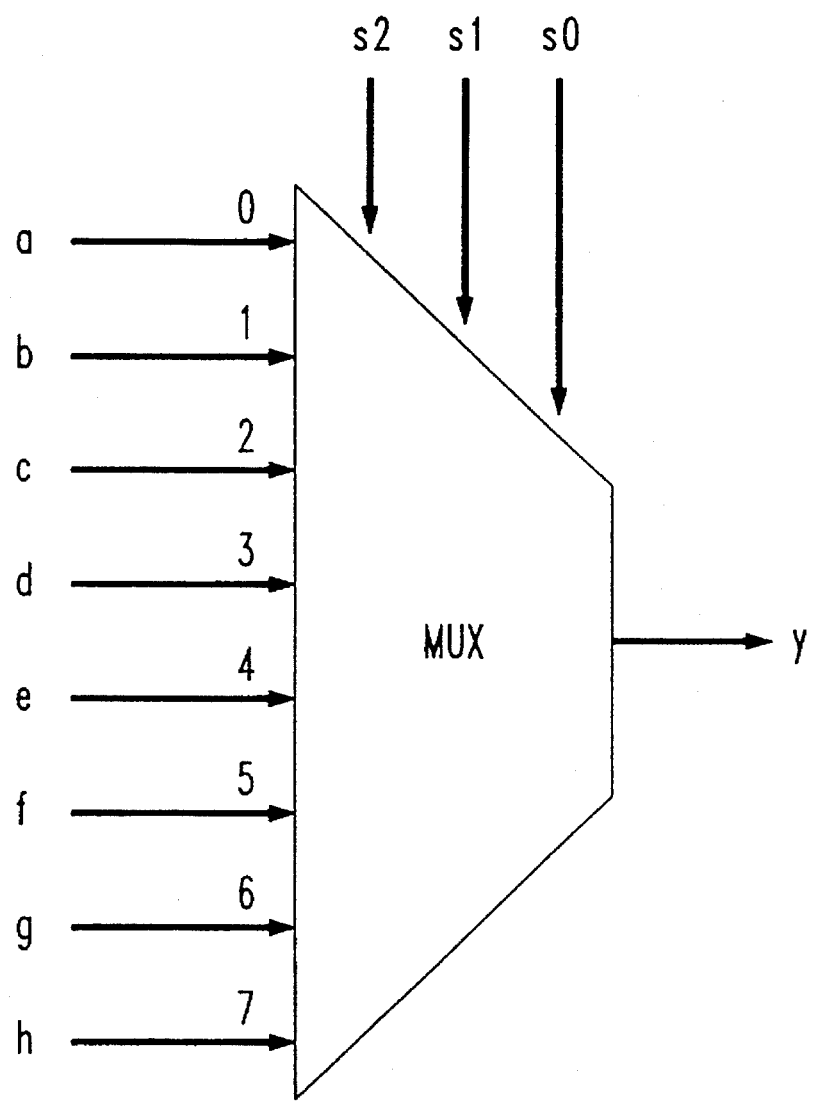
FIG. 17 shows a user defined 8-to-1 multiplexer.
Figure 18:
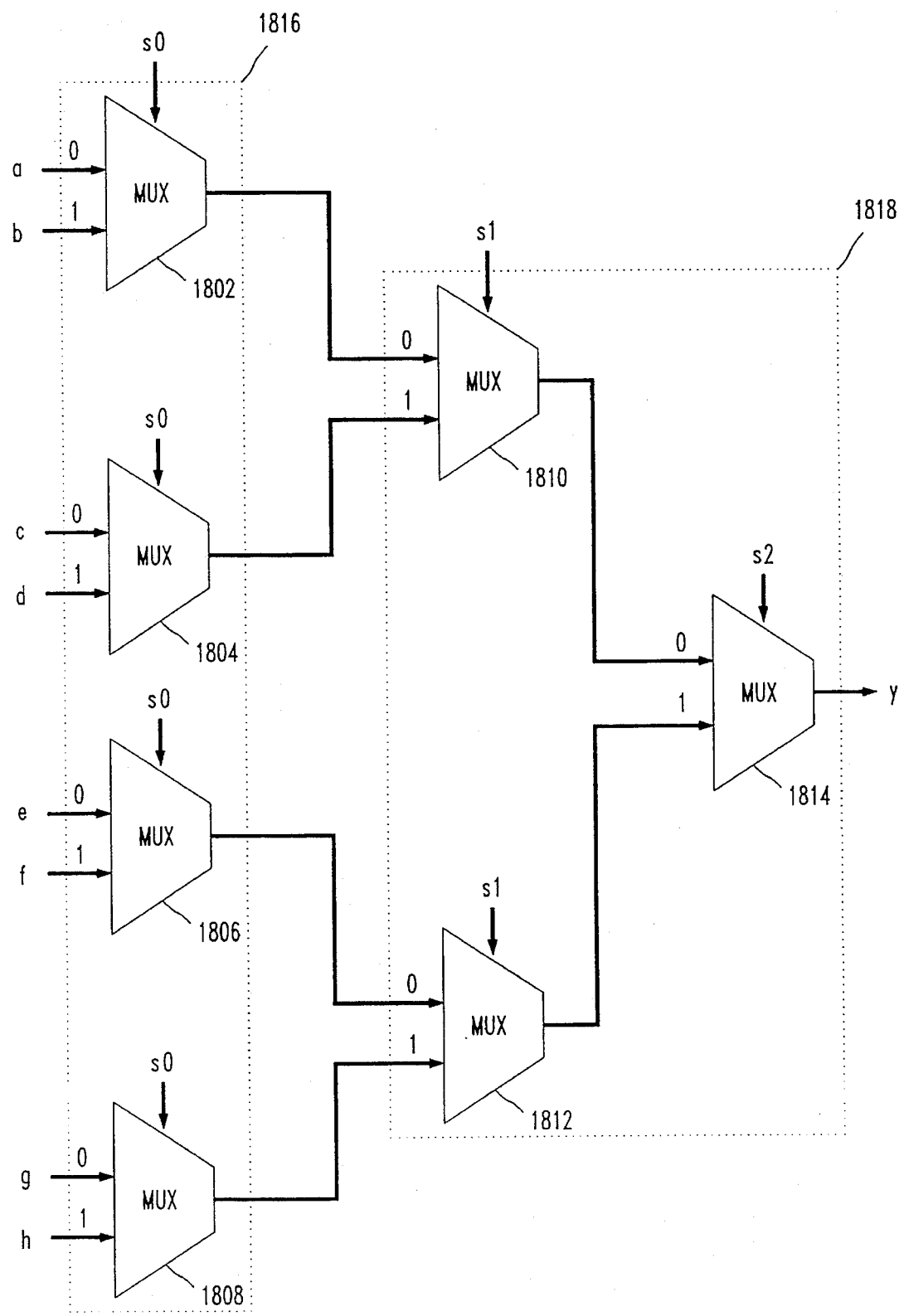
FIG. 18 shows an implementation of the user defined 8-to-1 multiplexer of FIG. 17.
Figure 19:
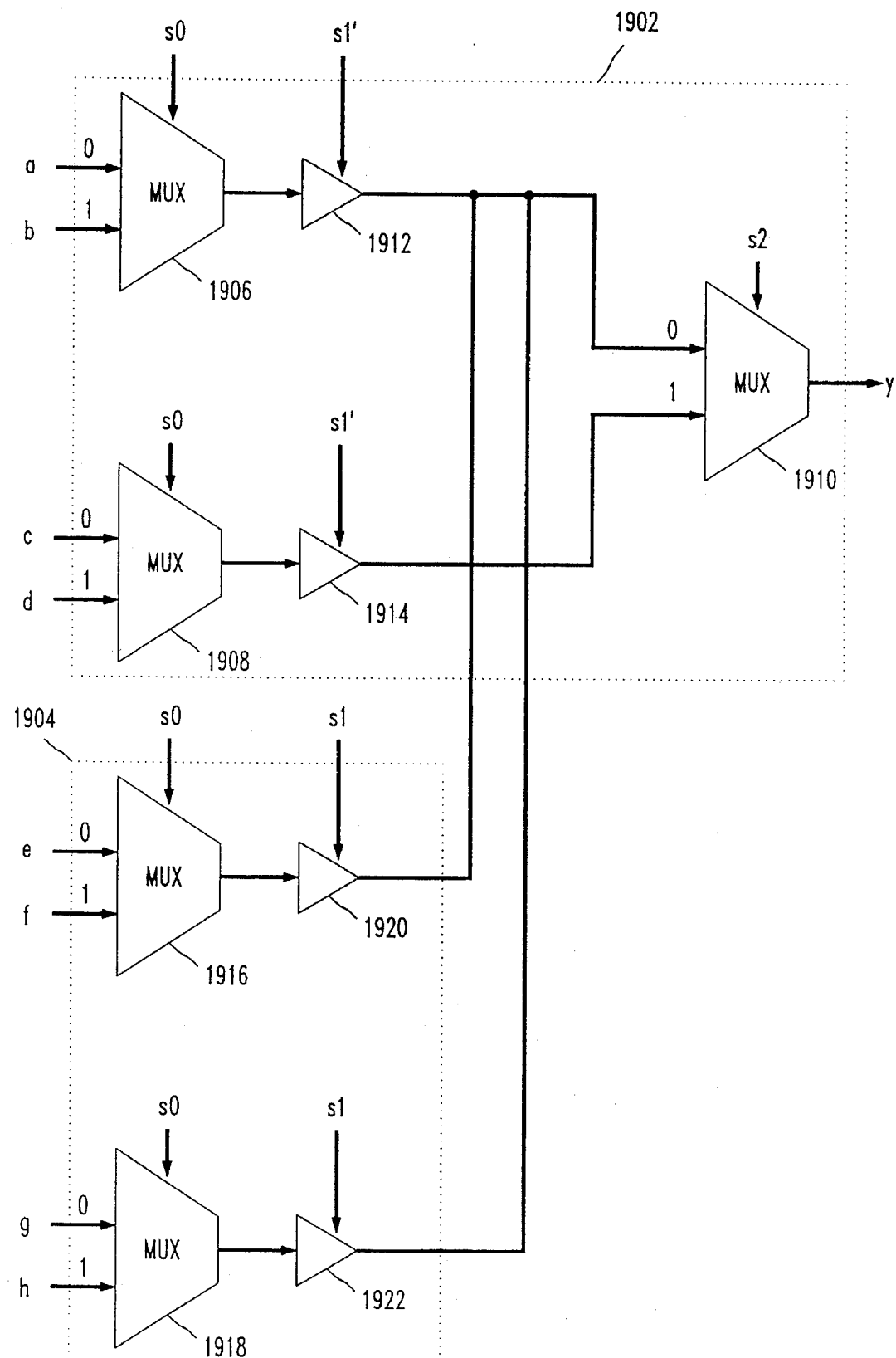
FIG. 19 shows an implementation of the user defined 8-to-1 multiplexer of FIG. 17.
Figure 20:
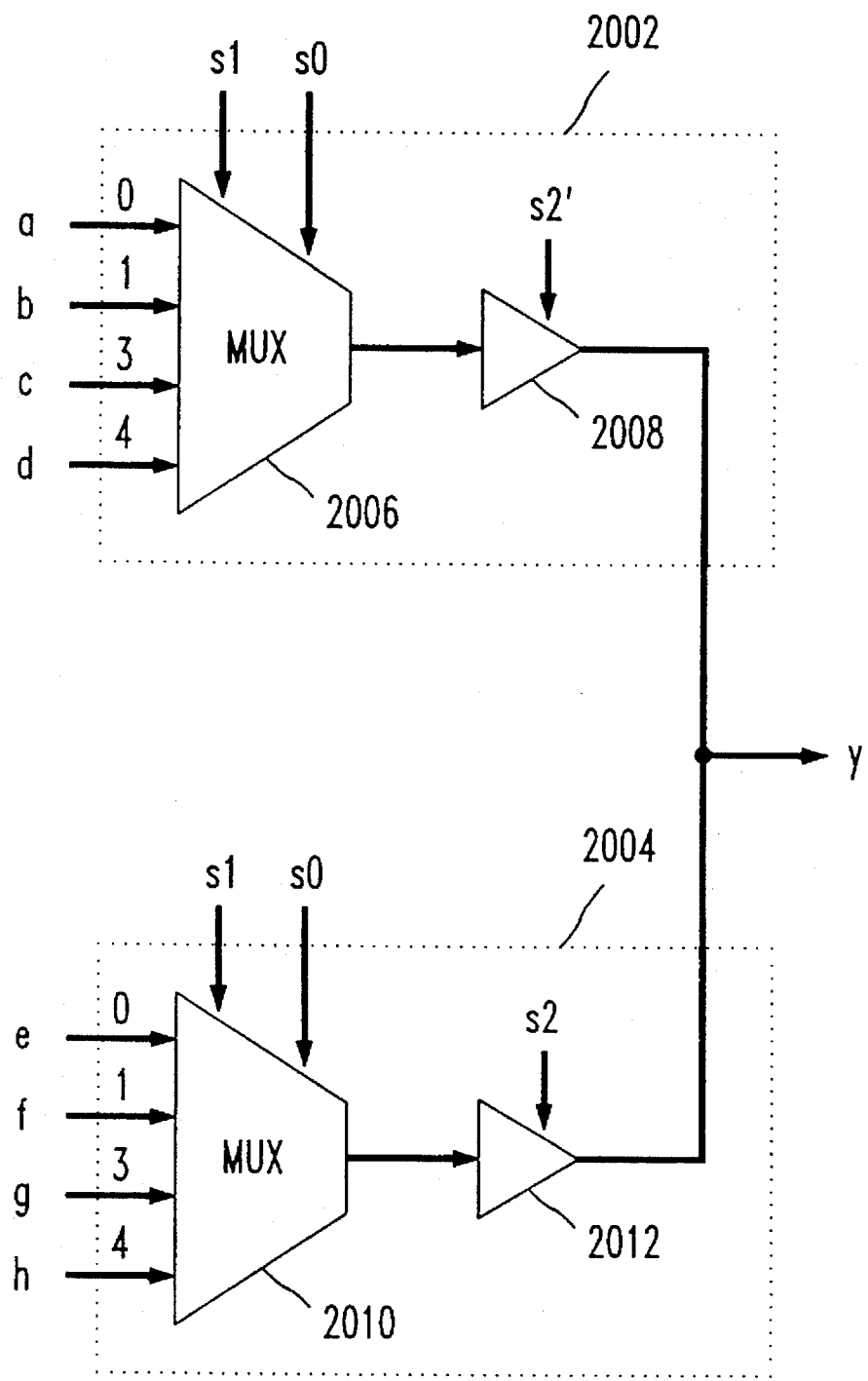
FIG. 20 shows an implementation of the user defined 8-to-1 multiplexer of FIG. 17.

As another example, consider an 8-to-1 multiplexer shown in FIG. 17. This multiplexer has eight input signals (a–h) and 3 select signals (s0, s1, s2). This multiplexer can be implemented in many different ways, three of which are shown in FIGS. 18–20. Each of the three implementations uses two PLCs.

The first implementation, FIG. 18, uses only lookup tables. Each 2-to-1 multiplexer 1802, 1804, 1806, 1808, 1810, 1812, 1814 is implemented by one 16-bit lookup table. This implementation requires 2 PLC's 1816, 1818. The other two implementations use tri-state buffers as well as lookup tables.

The implementation of FIG. 19 uses 2 PLC's 1902, 1904 to implement the 8-to-1 multiplexer. PLC 1902 uses three lookup tables to implement three 2-1 multiplexers 1906, 1908, 1910, and two tri-state buffers 1912, 1914. PLC 1904 uses two lookup tables to implement two 2-to-1 multiplexers 1916, 1918, and two tri-state buffers 1920, 1922.

The implementation of FIG. 20 uses 2 PLC's 2002, 2004 to implement the 8-to-1 multiplexer. PLC 2002 uses four lookup tables to implement a 4-to-1 multiplexer 2006, and a tri-state buffer 2008. PLC 2004 uses four lookup tables to implement a 4-to-1 multiplexer 2010, and a tri-state buffer 2012.

Assuming that the routing delay between PLC's is equal in FIGS. 18–20, the implementation in FIG. 20 is the best, since its signal delay is the smallest and each PLC has a small number of external connections. The implementation in FIG. 18 is the worst because it has the longest signal delay. Since all three implementations (FIGS. 18–20) use the same number of PLC's, the optimizer/compiler uses the implementation in FIG. 20, regardless of the specification in the .OPT field of the multiplexer module specification.

Compiling Finite State Machines

For the finite state machine (FSM) module, the optimizer/compiler uses a one-hot encoding scheme. That is, the optimizer/compiler produces N flip-flops, where N is the number of states of the FSM. The optimizer/compiler synthesizes a circuit such that only one flip-flop (among the N flip-flops) has the value of '1' at any given time. If a user specified a reset state, the optimizer/compiler produces a circuit that forces the flip-flop which corresponds to the reset state to have the value '1' when the reset signal is activated.

The optimizer/compiler performs similar synthesis operations for other modules. In view of the teachings of this specification, the synthesis of the other electronic circuit design modules can be readily implemented by one skilled in the art. Therefore, a detailed description of the synthesis of each module is not given here.

Referring back to FIG. 10, after the module synthesis and technology mapping step 1014 is complete, phase 2 optimization step 1016 takes place.

Phase Two Optimization

Phase 2 optimization will be described with reference to the flowchart of FIG.

As discussed above, the optimizer/compiler may generate additional circuits (e.g., 3-input AND gate 1556 in FIG. 15B) during the module synthesis. In general, such circuit elements are not mapped to a PLC during module synthesis.

The first step 2102 of phase 2 optimization is to check if there exists any unmapped circuit elements. If so, the system maps the circuit element to a PLC (i.e., allocates a PLC for the unmapped circuit element) in step 2104.

After all circuit elements are mapped to PLC's, the system checks if two different PLC's can be merged together in step 2106. If so, the two PLC's are merged together into one PLC in step 2108.

Figure 22:
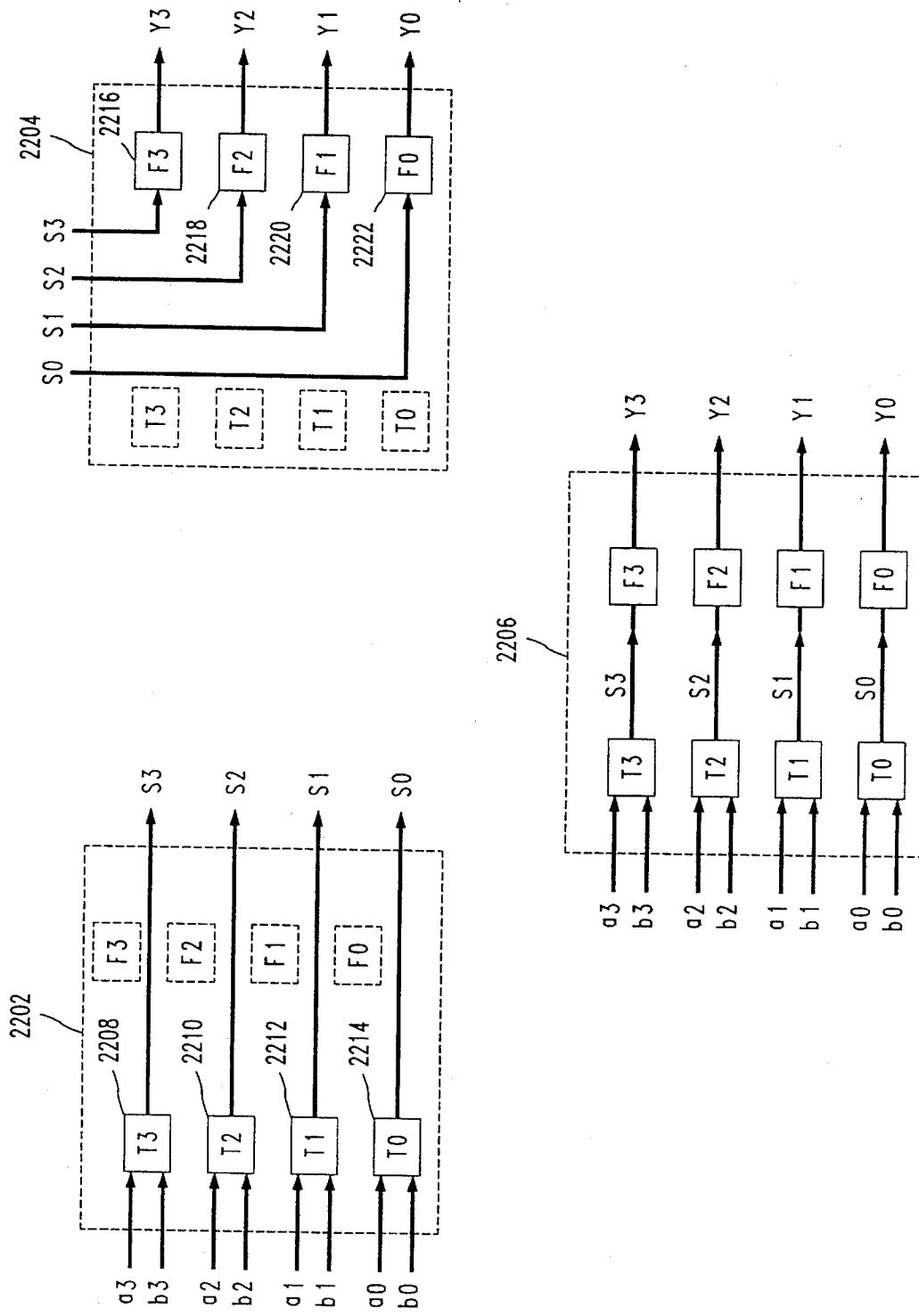
FIG. 22 shows an example of merging two logic cells together.

For example, consider PLC's 2202 and 2204 shown in FIG. 22. One PLC, 2202, implements a 4-bit adder using four lookup tables 208, 2210, 2212, 2214: and the other PLC 2204 implements a 4-bit register using four flip-flops 2216, 2218, 2220, 2222. The output signals of PLC 2202 (S3, S2, S1, S0) are the input signals to PLC 2204. The system recognizes that these two PLC's 2202, 2204 can be merged together, and it merges the two PLC's into one PLC 2206.

These phase 2 optimization operations are beneficial for many reasons. First, more logic resources are utilized in one PLC and, so, better circuits in terms of area are produced. Second, locality of circuit elements is exploited, producing better circuit performance. Third, routing requirements between PLC's are reduced.

Referring back to FIG. 10, after phase 2 optimization step 1016, the system will create a netlist format of the technology mapped circuits for the targeted FPGA in step 1018. This netlist format may vary depending on the FPGA to be used. For example, the format is the FAN language for AT&T's ORCA FPGA. A description of the petlist format for other FPGA's is readily available from the FPGA manufacturers.

In addition to producing a netlist of PLC's, the system also provides structure information of circuits as input to other tools (e.g., placement tool). For example, in FIG. 13B, the optimizer/compiler marks the three PLCs 1304, 1306, 1308 that implement one 32×4 user-defined memory as one group of PLCs. Similarly, in FIG. 14B the optimizer/compiler marks the three PLCs 1406, 1408, 1410 which implement a 10-bit adder as one group of PLCs. The marking is done by using the appropriate mechanism for the FAN language of the target FPGA technology. The placement tool will try to put those PLC's in the same group next to each other. This results in a more efficient FPGA implementation.

CIRCUIT DESIGN USING THE PRESENT INVENTION

The preceding detailed description described various aspects of the present invention. An example of the design of a simple circuit in accordance with the present invention is now provided to illustrate the progress and relationship of the steps from design through implementation in an FPGA.

Figure 23:
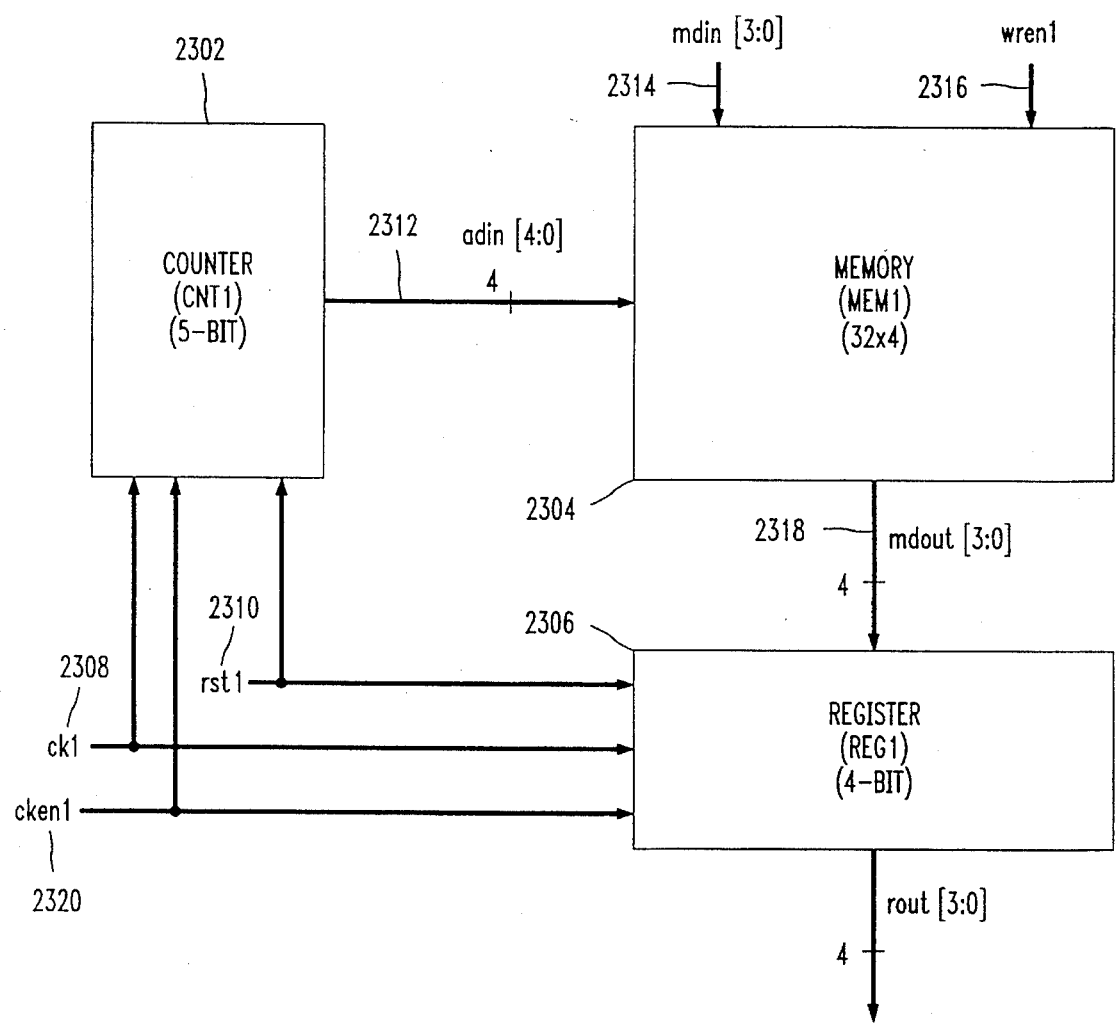
FIG. 23 shows a block diagram of a user defined circuit.

The example circuit 2300 to be implemented is shown in FIG. 23. The circuit consists of a 5-bit counter 2302, a 32×4 memory 2304, and a 4-bit register 2306. The counter 2302 has three inputs. The ck1 signal 2308 is the counter's clock signal. The rst1 signal 2310 is the counter's reset signal. The cken1 signal 2320 is the counter's clock-enable signal. The 5-bit output of the counter, the adin[4:0] signal 2312 is the address input to the memory 2304. As discussed in the prior section describing the HAN language, the adin[4:0] signal specification signifies 5 signals adin4, adin3, adin2, adin1 and adin0. The memory also has a data input signal mdin[3:0] 2314 which is a 4-bit input. The write enable signal of the memory 2304 is designated wren1 2316. The output of the memory 2304 is mdout[3:0] signal 2318.

The output of the memory 2304 is also the input to the register 2306. The register 2306 also has a reset signal rst1 2310, a clock signal ck1 2308, and a clock enable signal cken1 2320.

A designer could use the present invention to implement this circuit by either describing it in the HAN language, or by using the graphics tool to describe the circuit. First, the HAN description of the example circuit of FIG. 23 will be explained.

The HAN description of the circuit shown in FIG. 23 is as follows:

```
.CIRCUIT       test1
.PI            mdin [3:0] wren1 rst1 cken1 ck1
.PO            rout [3:0]
.COUNTER       cnt1 5
.CTYPE         UP
.DOUT          adin[4:0]
.CK            EDGE_HIGH CK1 cken1 1
.RESET         ASYNC_HIGH rst1
.ENDCOUNTER
.MEM           mem1 32 4
.ADDR          adin[4:0]
.DIN           mdin[3:0]
.DOUT          mdout[3:0]
.WREN          wren1
.ENDMEM
.REG           reg1 4
.CK            EDGE_HIGH ck cken1 1
.DIN           mdout[3:0]
.DOUT          rout[3:0]
.RESET         ASYNC_HIGH rst1
.ENDCIRCUIT
```

The details of the HAN language have already been discussed in the section entitled TEXTUAL DESCRIPTION OF CIRCUITS. Therefore, only certain details relating to the specific example will be further discussed.

In order to indicate that the output of one component is the input to another component, a single signal name is used in the description of each component. For example, in the circuit of FIG. 23, the output of the counter 2302 is the address input to the memory 2304. This signal is indicated in FIG. 23 at 2312. In order to indicate this relationship in the HAN language, the same signal name is used in both the memory module description and the counter module description. Thus, the .DOUT field in the counter module, which indicates the counter's output signal, contains the signal adin[4:0]. The .ADDR field of the memory module, which indicates the address input of the memory, contains the signal adin[4:0]. In a similar manner, the connection of the output of the memory 2304 to the input of the register 2306 is indicated in the HAN language by the common signal mdout[3:0].

Similarly, the register 2306 and counter 2302 share the same reset signal rst1 2310, clock signal ck1 2308, and clock enable signal cken1 2320.

As an alternative to describing this circuit in the HAN format, a circuit designer could use the graphics tool, as described above, in the section entitled GRAPHICS TOOL. Referring to FIG. 6, the designer would place counter icon 650, memory icon 656, and register icon 652 into the canvas area 608 of the window 600. The various attributes of each module would then be specified through the use of a multibox. For example, the specification of the attributes of the register module 652 in this manner are shown in multibox 630. The attributes for the memory module and the counter module would be specified in a similar manner.

The primary I/O signals would be then specified by placing the PRIMARY I/O icon 658 in the canvas area 608 and specifying the primary I/O signals by using a multibox. A more informative graphics view can be displayed as shown in FIG. 7.

If the designer specifies the circuit description using the graphics tool, the system will translate that graphical description into the HAN file description of the circuit.

Once the HAN file is created, by either the designer entering the circuit description in the HAN language directly, or by having the system convert the graphical representation of the circuit into the HAN language, optimization/compilation may begin.

Referring to FIG. 10, the first step 1004 is reading the input and output signals. In the present example, the system will read mdin[3:0], wren1, rst1, cken1, ck1 and rout[3:0], since these signals were specified as the primary input and output signals. In step 1006 the system will read the counter module description and will save the information contained in that specification in step 1008. The system will then read the memory module description and the register module description and save the information. Since the register module is last, there will be no more modules to read, condition 1010 will be satisfied, and the system will begin phase one optimization step 1012.

During phase one optimization (see FIG. 11) the system will first determine whether the counter and the register use the same reset signal with the same polarity in step 1102. Since both the counter and register use the rst1 reset signal, the system will eliminate these local reset signals and will replace them with a global reset in the FPGA implementation in step 1104.

The step 1106 of checking whether a polarity change will result in improved efficiency follows. Since a polarity change would not result in improved efficiency, there is no polarity switch.

Figure 24:
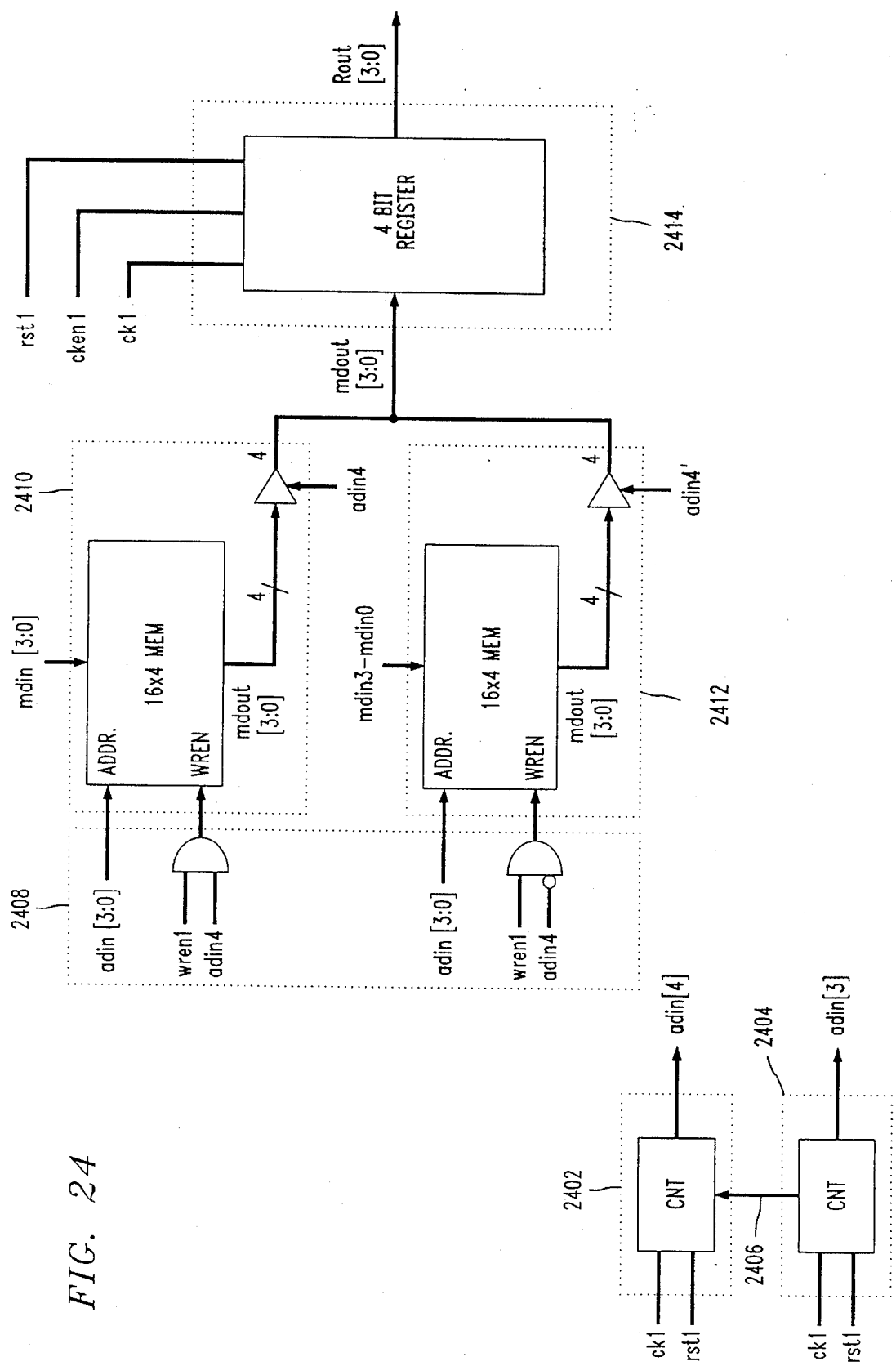
FIG. 24 shows a block diagram of an FPGA implementation of the circuit in FIG. 23.

After phase one optimization, the system moves on to module synthesis and technology mapping step 1014 (FIG. 10). First, a counter implementation will be developed. As discussed in connection with FIGS. 14A and 14B, a 5-bit counter will require a 2 PLC implementation. Such an implementation would be as shown in. FIG. 24. Two PLC's 2402, 2404 are required to implement the circuit. Also, the system introduces a carry signal 2406 between the PLC's.

Next, the system will implement the memory module. The system will implement the memory module in 3 PLC's 2408, 2410, 2412. Memory module synthesis is discussed above in greater depth in connection with FIGS. 13A and 13B.

Finally, the system will implement the register module. This module will be implemented in one PLC 2414, since one PLC of ORCA FPGA can implement a 4-bit register.

Figure 21:
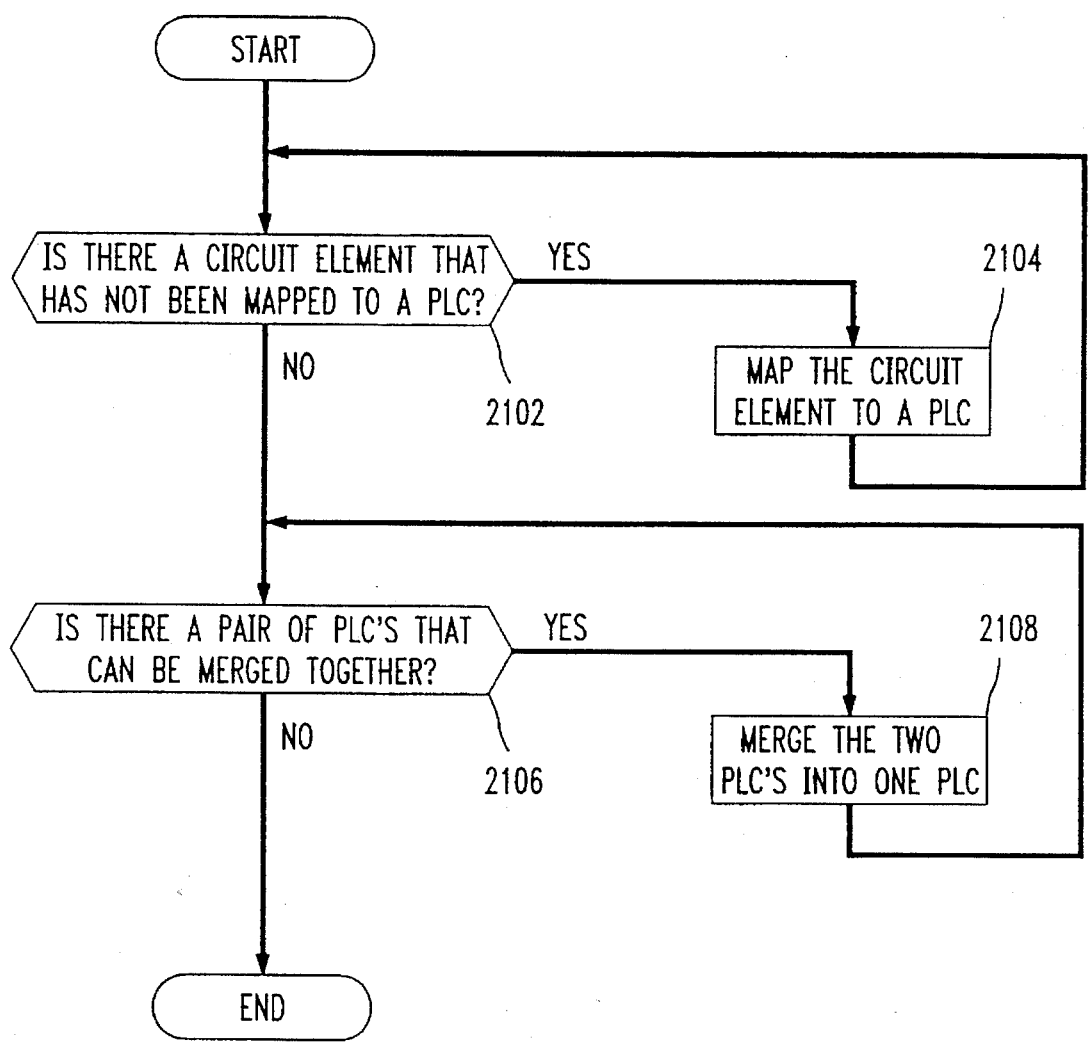
FIG. 21 shows a flow diagram of phase 2 optimization.

Returning now to FIG. 10, since module synthesis and technology mapping step 1014 is complete, phase 2 optimization step 1016 will begin. As shown in FIG. 21, the first step 2102 is to check if there exists any circuit element that has not been mapped to a PLC. Since there is not such an element, the system moves to step 2105.

Figure 25:
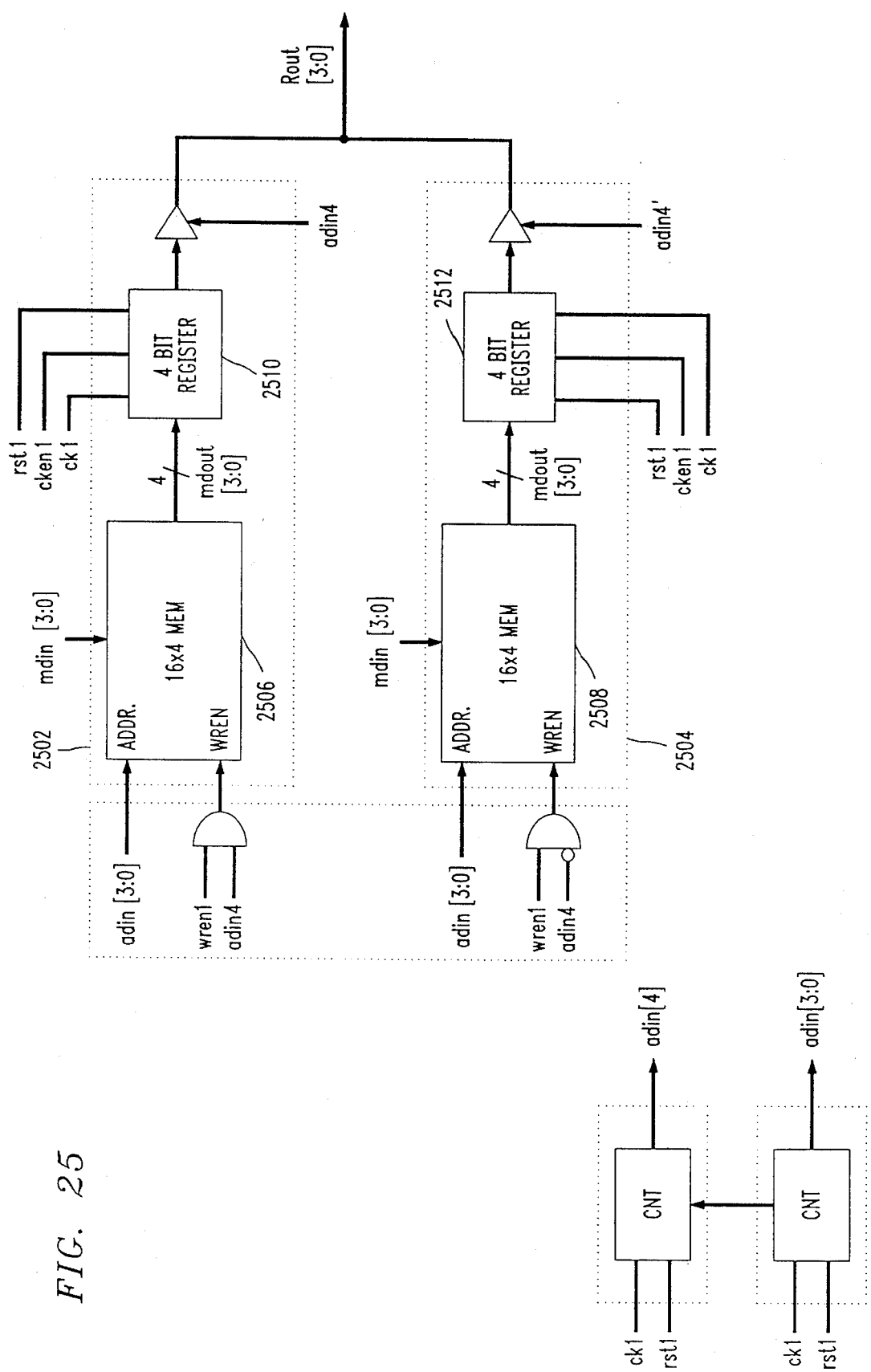
FIG. 25 shows a block diagram of an optimized FPGA implementation of the circuit in FIG. 23.

The system recognizes that PLC 2414 (FIG. 24) can be merged to PLC's 2410 and 2412 resulting in one less PLC in the final implementation. Thus, the system performs step 2108 (FIG. 21) and produces the circuit shown in FIG. 25. Note that PLC's 2502 and 2504 contain not only a 16×4 memory 2506, 2508 but also a 4-bit register 2510, 2512.

After the phase 2 optimization is completed, the final step 1018 (FIG. 10) would be to print the resulting technology mapped circuit in a netlist format of the target FPGA.

It is to be understood that the embodiments and variations shown and described herein are illustrative of the principles of this invention only and that various modifications may be implemented by those skilled in the art without departing from the scope and spirit of the invention.

We claim:

1. A structured circuit synthesis system for optimizing a circuit implementation in a field programmable gate array, wherein said field programmable gate array comprises a plurality of programmable logic cells connected by programmable routing, the system comprising:

a computer processor;

means for storing a description of a first electronic circuit design module specifying an output signal and a polarity of said output signal, and a second electronic circuit design module specifying an input signal and a polarity of said input signal, said output signal of the first module corresponding to the input signal of said second module; and means for receiving the input signal and the output signal and reversing the signal polarities of said input signal and said output signal to synthesize multiple modules simultaneously to reduce the number of programmable logic cells required to implement said first module and said second module in the field programmable gate array.

2. The system of claim 1 wherein said description of electronic design modules is a textual language in terms of parameterized modules.

3. The system of claim 1 wherein said description of electronic circuit design modules is a collection of graphical icons representative of electronic design elements and attributes of said modules associated with said icons.

4. The system of claim 1, further comprising means for producing output for processing by a placement tool.

5. The system of claim 1, wherein the means for receiving comprises means for receiving descriptions of at least one of finite state machines and Boolean equations.

6. A structured circuit synthesis system for synthesizing a circuit implementation in a field programmable gate array, wherein said field programmable gate array comprises a plurality of programmable logic cells connected by programmable routing, the system comprising:

a computer processor;

means for storing a textual description of a first electronic circuit design element connected to a second electronic circuit design element, wherein the circuit design elements comprise at least a random logic circuit and a datapath module;

means for receiving the textual description and implementing said first electronic circuit design element and said second electronic circuit design element in at least one programmable logic cell such that the output of said first electronic circuit design element is connected to said second electronic circuit design element; and means for optimizing the field programmable gate array implementation of said first and second electronic circuit design elements.

7. The system of claim 6 wherein said means for optimizing comprises:

means for implementing said first and second electronic circuit design elements in at least one programmable logic cell so as to minimize the number of programmable logic cells.

8. The system of claim 6 wherein said means for optimizing comprises:

means for implementing said first and second electronic circuit design elements in at least one programmable logic cell so as to minimize the timing of said implementation.

9. The system of claim 6 wherein said means for optimizing comprises:

means for implementing said first electronic circuit design element and said second electronic circuit design element in one programmable logic cell.

10. A method for optimizing a field programmable gate array configuration with a structured circuit synthesis system, wherein said field programmable gate array comprises a plurality of programmable logic cells connected by programmable routing, the method comprising the steps of:

storing a description of a first electronic circuit design module specifying an output signal and a polarity of said output signal, and a second electronic circuit design module specifying an input signal and a polarity of said input signal, said output signal of the first module corresponding to the input signal of said second module; and receiving the input signal and the output signal and reversing the signal polarities of said input signal and said output signal to synthesize multiple modules simultaneously to reduce the number of programmable logic cells required to implement said first module and said second module in the field programmable gate array.

11. The method of claim 10 wherein said description of electronic circuit design modules is a textual language in terms of parameterized modules.

12. The method of claim 10 wherein said description of electronic circuit design modules is a collection of graphical icons representative of said electronic circuit design modules and attributes of said modules associated with said icons.

13. A method for synthesizing a circuit implementation in a field programmable gate array with a structured circuit synthesis system, wherein said field programmable gate array comprises a plurality of programmable logic cells connected by programmable routing, the method comprising the steps of:

storing a textual description of a first electronic circuit design element connected to a second electronic circuit design element, wherein the circuit design elements comprise at least a random logic circuit and a datapath module;

receiving the textual description and implementing said first electronic circuit design element and said second electronic circuit design element in at least one programmable logic cell such that the output of said first electronic circuit design element is connected to said second electronic circuit design element; and optimizing the field programmable gate array implementation of said first and second electronic circuit design elements.

14. The method of claim 13 wherein said step of optimizing further comprises the step of:

implementing said first and second electronic circuit design elements in at least one programmable logic cell so as to minimize the number of programmable logic cells.

15. The method of claim 13 wherein said step of optimizing further comprises the step of:

implementing said first and second electronic circuit design elements in at least one programmable logic cell so as to minimize the timing of said implementation.

16. The method of claim 13 wherein said step of optimizing further comprises the step of:

implementing said first electronic circuit design element and said second electronic circuit design element in one programmable logic cell.

17. A system for synthesizing circuits in a field programmable gate array from a high level description, wherein said field programmable gate array comprises a plurality of programmable logic cells connected by programmable routing, the system comprising:

means for providing an electronic circuit description describing a plurality of electronic circuit elements in terms of parameterized modules, said electronic circuit elements including finite state machines;

a compiler for compiling said electronic circuit description into field programmable gate array configuration data;

means for producing a field programmable gate array implementation from said field programmable gate array configuration data; and means for optimizing the field programmable gate array implementation.

18. The system of claim 17 wherein said means for providing an electronic circuit description further comprises:

a graphical display monitor for displaying a plurality of icons representative of said plurality of electronic circuit elements in a first portion of said graphical display monitor;

a graphical input device for choosing electronic circuit elements by positioning said icons in a second portion of said graphical display monitor;

an input device for assigning attributes to chosen electronic circuit elements; and a translator for generating said electronic circuit description from said chosen electronic circuit elements and assigned attributes.

19. The system of claim 17 wherein said field programmable gate array configuration data is a field programmable gate array application netlist.

20. The system of claim 17 wherein said electronic circuit description describes a memory module containing initial contents.

21. A system for synthesizing circuits in a field programmable gate array from a high level description, wherein said field programmable gate array comprises a plurality of programmable logic cells connected by programmable routing, the system comprising:

means for providing an electronic circuit description describing a plurality of electronic circuit elements in terms of parameterized modules;

a compiler for compiling said electronic circuit description into field programmable gate array configuration data including group information identifying a plurality of programmable logic cells as belonging to a group;

means responsive to said group information for receiving said programmable gate array configuration data and for generating a field programmable gate array implementation wherein said plurality of programmable logic cells identified as belonging to a group are located closer to each other than to programmable logic cells not identified as belonging to the group; and means for optimizing the field programmable gate array implementation.

22. The system of claim 21 wherein said electronic circuit elements include finite state machines.

23. The system of claim 21 wherein said means responsive to said group information includes a placement tool.

24. A method for synthesizing circuits in a field programmable gate array from a high level description, wherein said field programmable gate array comprises a plurality of programmable logic cells connected by programmable routing, the method comprising the steps of:

providing an electronic circuit description describing a plurality of electronic circuit elements in terms of parameterized modules, said electronic circuit elements including finite state machines;

compiling said electronic circuit description into field programmable gate array configuration data;

producing a field programmable gate array implementation from said field programmable gate array configuration data; and optimizing the field programmable gate array implementation.

25. The method of claim 24 wherein said step of providing an electronic circuit description further comprises the steps of:

displaying a plurality of icons representative of said plurality of electronic circuit elements in a first portion of a graphical display monitor;

choosing electronic circuit elements by positioning said icons in a second portion of said graphical display monitor using a graphical input device;

assigning attributes to chosen electronic circuit elements; and generating said electronic circuit description from said chosen electronic circuit elements and assigned attributes.

26. The method of claim 24 wherein said field programmable gate array configuration data is a field programmable gate array application netlist.

27. The method of claim 24 wherein said electronic circuit description describes a memory module containing initial contents.

28. A method for synthesizing circuits in a field programmable gate array from a high level description, wherein said field programmable gate array comprises a plurality of programmable logic cells connected by programmable routing, the method comprising the steps of:

providing an electronic circuit description describing a plurality of electronic circuit elements in terms of parameterized modules;

compiling said electronic circuit description into field programmable gate array configuration data including group information identifying a plurality of programmable logic cells as belonging to a group;

generating a field programmable gate array implementation from said gate array configuration data, wherein said plurality of programmable logic cells identified as belonging to a group are located closer to each other than to programmable logic cells not identified as belonging to the group; and optimizing the field programmable gate array implementation.

29. The method of claim 28 wherein said electronic circuit elements include finite state machines.

* * * * *